US012532541B2

(12) United States Patent
Lee et al.

(10) Patent No.: US 12,532,541 B2
(45) Date of Patent: Jan. 20, 2026

(54) DISPLAY DEVICE

(71) Applicant: SAMSUNG DISPLAY CO., LTD., Yongin-si (KR)

(72) Inventors: Kang Young Lee, Yongin-si (KR); Chang Il Tae, Yongin-si (KR); Xinxing Li, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 461 days.

(21) Appl. No.: 18/010,893

(22) PCT Filed: Jun. 9, 2021

(86) PCT No.: PCT/KR2021/007228
§ 371 (c)(1),
(2) Date: Dec. 16, 2022

(87) PCT Pub. No.: WO2021/256771
PCT Pub. Date: Dec. 23, 2021

(65) Prior Publication Data
US 2023/0238402 A1 Jul. 27, 2023

(30) Foreign Application Priority Data
Jun. 18, 2020 (KR) .................... 10-2020-0074476

(51) Int. Cl.
*H01L 27/12* (2006.01)
*H01L 25/16* (2023.01)
(Continued)

(52) U.S. Cl.
CPC .......... *H10D 86/60* (2025.01); *H01L 25/167* (2013.01); *H10D 86/471* (2025.01)

(58) Field of Classification Search
CPC ...... H10D 86/60; H10D 86/471; H10D 86/40; H10D 86/441; H10D 89/60; H10D 89/00;
(Continued)

(56) References Cited

U.S. PATENT DOCUMENTS 7,727,823 B2  6/2010  Jeong et al.
8,742,784 B2  6/2014  Kim et al.
(Continued)

FOREIGN PATENT DOCUMENTS

JP  2007-011256  1/2007
JP  4814394  11/2011
(Continued)

OTHER PUBLICATIONS

International Search Report, corresponding to International Application No. PCT/KR2021/007228 dated Sep. 29, 2021.
(Continued)

*Primary Examiner* — Nikolay K Yushin
(74) *Attorney, Agent, or Firm* — Womble Bond Dickinson (US) LLP

(57) ABSTRACT

A display device includes a base layer including a display area and a non-display area, a pixel circuit layer disposed on a front surface of the base layer and including a driving transistor and a switch transistor, and an antistatic circuit layer disposed on a rear surface of the base layer and including at least one electrostatic diode.

25 Claims, 22 Drawing Sheets

(51) Int. Cl.
*H10D 86/40* (2025.01)
*H10D 86/60* (2025.01)

(58) Field of Classification Search
CPC .. H10D 89/611; H10D 89/811; H01L 25/167; H01L 25/16; H01L 25/075; H01L 25/0753
See application file for complete search history.

(56) References Cited

U.S. PATENT DOCUMENTS

| | | | |
|---|---|---|---|
| 8,872,214 | B2 | 10/2014 | Negishi et al. |
| 9,287,242 | B2 | 3/2016 | Shibata et al. |
| 9,570,425 | B2 | 2/2017 | Do |
| 9,690,152 | B2 * | 6/2017 | Li .................. H10D 86/443 |
| 9,773,761 | B2 | 9/2017 | Do |
| 10,157,897 | B1 * | 12/2018 | Smith .................. H10H 20/812 |
| 10,600,856 | B2 | 3/2020 | Kim et al. |
| 11,957,010 | B2 * | 4/2024 | Jeong .................. H10K 59/131 |
| 2006/0289868 | A1 * | 12/2006 | Jeong .................. H10D 30/6758 257/E29.295 |
| 2011/0089850 | A1 | 4/2011 | Shibata et al. |
| 2014/0061610 | A1 | 3/2014 | Mun et al. |
| 2017/0031218 | A1 * | 2/2017 | Li .................. H10D 86/421 |
| 2021/0118968 | A1 | 4/2021 | Lee et al. |
| 2021/0167050 | A1 | 6/2021 | Cho et al. |
| 2021/0202676 | A1 * | 7/2021 | Jeong .................. H10K 59/10 |

FOREIGN PATENT DOCUMENTS

| | | |
|---|---|---|
| JP | 4914929 | 4/2012 |
| KR | 10-2011-0024450 | 3/2011 |
| KR | 10-1436123 | 11/2014 |
| KR | 10-1490758 | 2/2015 |
| KR | 10-2018-0062520 | 6/2018 |
| KR | 10-2019-0113535 | 10/2019 |
| KR | 10-2020-0021014 | 2/2020 |
| KR | 10-2020-0036839 | 4/2020 |
| KR | 10-2021-0048005 | 5/2021 |
| WO | 2019/190042 | 10/2019 |

OTHER PUBLICATIONS

Written Opinion, with English translation, corresponding to International Application No. PCT/KR2021/007228, dated Sep. 29, 2021.

* cited by examiner

DISPLAY DEVICE

CROSS-REFERENCE TO RELATED APPLICATIONS

This application is a U.S. National Phase patent application of International Patent Application Number PCT/KR2021/007228, filed on Jun. 9, 2021, which claims priority to Korean Patent Application Number 10-2020-0074476, filed on Jun. 18, 2020, the entire contents of all of which are incorporated by reference herein.

BACKGROUND

1. Technical Field

The disclosure relates to a display device.

2. Description of the Related Art

Recently, interest in an information display is being increased. Accordingly, research and development on the display device is continuously conducted.

SUMMARY

An object to be solved by the disclosure is to provide a display device in which a width of a non-display area is minimized.

Another object to be solved by the disclosure is to provide a display device including an antistatic circuit and minimizing a width of a non-display area.

The objects of the disclosure are not limited to the object described above, and other technical objects which are not described will be clearly understood by those skilled in the art from the following description.

According to an embodiment of the disclosure for solving the above-described object, a display device may include a base layer including a display area and a non-display area, a pixel circuit layer disposed on a front surface of the base layer and including a driving transistor and a switch transistor, and an antistatic circuit layer disposed on a rear surface of the base layer and including at least one electrostatic diode.

The antistatic circuit layer may include an electrostatic diode disposed to overlap the display area in a thickness direction of the base layer.

The display device may further include a driver IC disposed on a rear surface of the antistatic circuit layer. A line of the driver IC may be electrically connected to the electrostatic diode.

The antistatic circuit layer may include an electrostatic diode in a transistor form.

The electrostatic diode may be a bottom gate type.

The display device may further include a via hole passing through the front surface and the rear surface of the base layer.

The pixel circuit layer may further include a connection electrode, and the connection electrode may be electrically connected to the at least one electrostatic diode of the antistatic circuit layer through the via hole.

A width of the non-display area may be less than or equal to about 1 mm.

The display device may further include a pixel emission layer disposed on a front surface of the pixel circuit layer and including a light emitting element.

The pixel emission layer may further include a first electrode electrically connected to the driving transistor, and a second electrode disposed to be spaced apart from the first electrode. The light emitting element may be electrically connected to the first electrode and the second electrode.

A length of the light emitting element may be in a range of about 100 nm to about 10 μm.

The display device may further include a color conversion element layer disposed on a front surface of the pixel emission layer and including a quantum dot.

The at least one electrostatic diode may include an oxide semiconductor.

The antistatic circuit layer may include a first electrostatic diode and a second electrostatic diode electrically connected in series with each other.

The first electrostatic diode may include a first gate electrode, a first semiconductor pattern overlapping the first gate electrode in a thickness direction of the base layer, and a first source/drain electrode and a second source/drain electrode, each electrically contacting the first semiconductor pattern. The second electrostatic diode may include a second gate electrode, a second semiconductor pattern overlapping the second gate electrode in the thickness direction, and the second source/drain electrodes and a third source/drain electrode, each electrically contacting the second semiconductor pattern.

The first source/drain electrode and the third source/drain electrode may be different portions of an electrode pattern.

The first gate electrode and the second gate electrode may be separated from each other.

The first source/drain electrode may be electrically connected to a connection electrode disposed in the pixel circuit layer, and the third source/drain electrode may be electrically connected to a line of a driver IC.

The first electrostatic diode and the second electrostatic diode may be diode-connected transistors electrically connected in opposite directions.

According to another embodiment of the disclosure for solving the above-described object, a display device may include a base layer, a pixel circuit layer disposed on the base layer and including a driving transistor and a switch transistor, and an antistatic circuit layer including at least one electrostatic diode and disposed in a direction different from a direction the pixel circuit layer is disposed.

The display device may further include a pixel emission layer including a light emitting element, and disposed in a direction different from of the direction the antistatic circuit layer is disposed.

The antistatic circuit layer may include an electrostatic diode disposed to overlap an emission area defined by the light emitting element in a thickness direction of the base layer.

The pixel circuit layer may be disposed on a front surface of the base layer, and the antistatic circuit layer may be disposed on a rear surface of the base layer.

The antistatic circuit layer may be formed after the pixel circuit layer is formed.

The display device may further include a via hole passing through a front surface and a rear surface of the base layer. The via hole may be formed after the pixel circuit layer is formed, and before the antistatic circuit layer is formed.

The details of other embodiments are included in the detailed description and drawings.

According to embodiments of the disclosure, a display device may implement a narrow bezel while including an antistatic circuit.

An effect according to embodiments is not limited by the contents above, and more various effects are included in the specification.

DETAILED DESCRIPTION OF EMBODIMENTS

Figure 1:
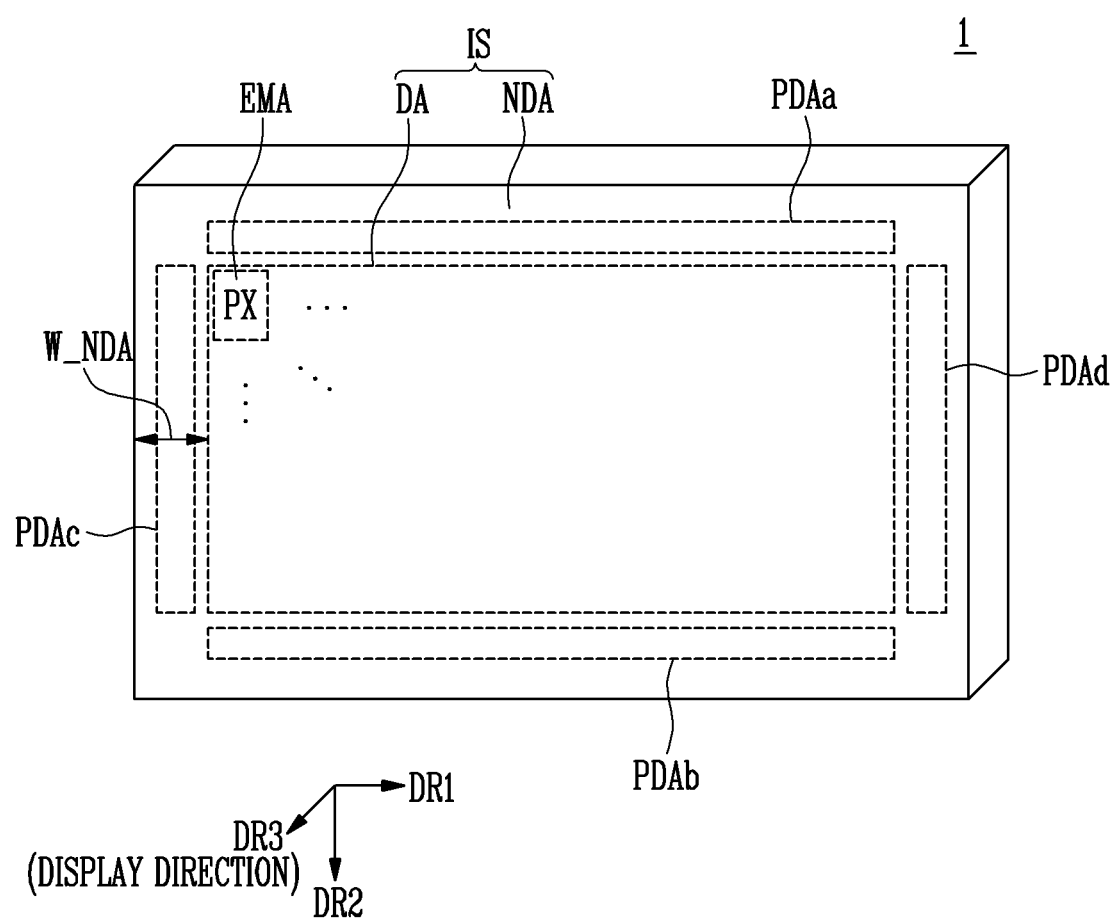
FIG. 1 is a perspective view illustrating a display device according to an embodiment of the disclosure.

The advantages and features of the disclosure and a method of achieving them will become apparent with reference to the embodiments described in detail below together with the accompanying drawings. However, the disclosure is not limited to the embodiments disclosed below, and may be implemented in various different forms, and the embodiments are provided so that the disclosure will be more thorough and complete and those skilled in the art to which the disclosure pertains can fully understand the scope of the disclosure.

A case in which an element or a layer is referred to as "on" another element or layer includes a case in which another layer or another element is disposed on the another element or between the other layers.

Although a first, a second, and the like are used to describe various components, these components are not limited by these terms. These terms are used only to distinguish one component from another component. Therefore, a first component described below may be a second component within the technical spirit of the disclosure. The singular expression includes the plural expression unless the context clearly dictates otherwise.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in detail with reference to the accompanying drawings. The same or similar reference numerals are used for the same configuration in the drawings.

FIG. 1 is a perspective view illustrating a display device according to an embodiment of the disclosure.

Referring to FIG. 1, the display device 1 may display an image through a display surface IS.

Hereinafter, as the display device 1, a large-sized electronic device such as a television is described as an example. However, the disclosure may be applied to a display device 1 with a small-sized electronic device such as a smartphone, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, or a wearable device in case that the display surface IS is applied to at least one surface.

The display surface IS may be a surface placed on a front surface of the display device 1, and may have a planar shape defined by a first direction DR1 and a second direction DR2 intersecting the first direction DR1. However, the disclosure is not limited thereto, and the display device 1 according to another embodiment may be implemented so that the display surface IS has a curved surface, and, a display direction may have several directions. A display direction may be defined as a normal direction of the display surface IS. For example, the display direction is shown as a third direction DR3 intersecting both of the first direction DR1 and the second direction DR2 in FIG. 1.

A thickness direction of the display device 1 may be indicated by the normal direction (for example, the third direction DR3) of the display surface IS. A front surface (or an upper surface) and a rear surface (or a lower surface) of each member may be divided in the third direction DR3. However, directions indicated by the first to third directions DR1, DR2, and DR3 are relative concepts that may be orthogonal to each other and may be converted into other directions. Hereinafter, the first to third directions DR1, DR2, and DR3 refer to the same reference numerals as the directions indicated by the first to third directions DR1, DR2, and DR3, respectively.

The display surface IS may include a display area DA that is an area in which an image is displayed and a non-display area NDA adjacent to the display area DA. The display area DA may be defined by each of light emitting elements and may include multiple emission areas EMA respectively emitting light of a color. For example, the display area DA may be a set of the emission areas EMA. As an embodiment, the display area DA may have a quadrangular shape.

The non-display area NDA may be an area in which an image is not displayed. The non-display area NDA may be disposed to surround the display area DA in a plan view. However, an embodiment is not limited thereto, and a shape of the display area DA and a shape of the non-display area NDA may be relatively designed.

A boundary between the non-display area NDA and the display area DA may be defined by a boundary between the emission areas EMA disposed at an edge of the display area DA. The non-display area NDA may have a width W_NDA defined from the boundary between the non-display area NDA and the display area DA to an adjacent side of the display device 1.

Various lines and/or built-in circuits connected to pixels PX of the display area DA may be disposed in the non-display area NDA.

The non-display area NDA may include a pad area. The pad area may be an area including multiple pad terminals. Multiple circuit films or the like may be attached to each pad area. As an embodiment, the pad area may be formed in the non-display area NDA provided around the display area DA. For example, in the drawing, a first pad area PDAa may be disposed on an upper side of the display area DA, a second pad area PDAb may be disposed on a lower side of the display area DA, a third pad area PDAc may be disposed on a left side of the display area DA, and a fourth pad area PDAd may be disposed on a right side of the display area DA. However, according to an embodiment, some of the first to fourth pad areas PDAa, PDAb, PDAc, and PDAd may be omitted.

Figure 2:
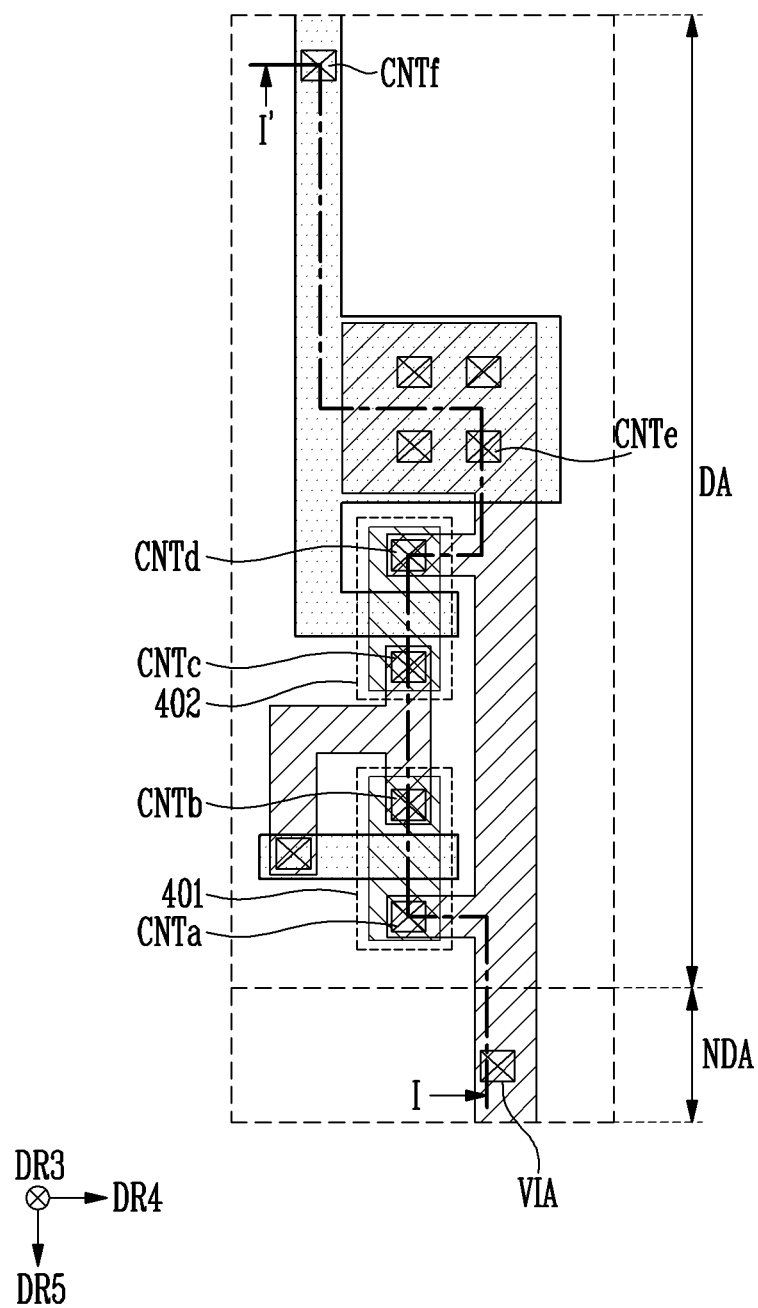
FIG. 2 is a layout diagram schematically illustrating electrostatic diodes in a display device according to an embodiment of the disclosure.
Figure 3:
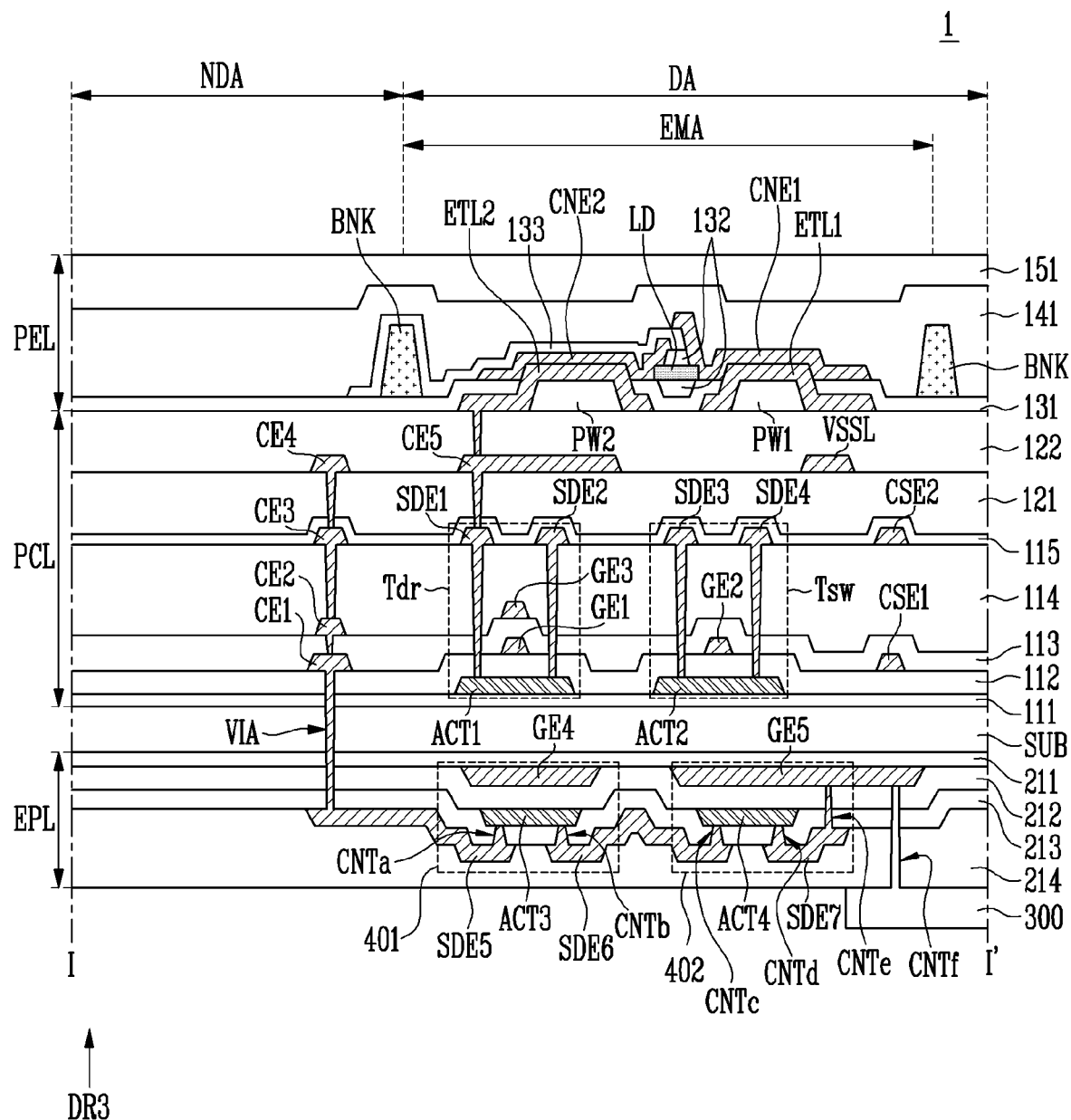
FIG. 3 is a schematic cross-sectional view of a display device schematically illustrating a portion corresponding to line I-I' of FIG. 2.
Figure 4:
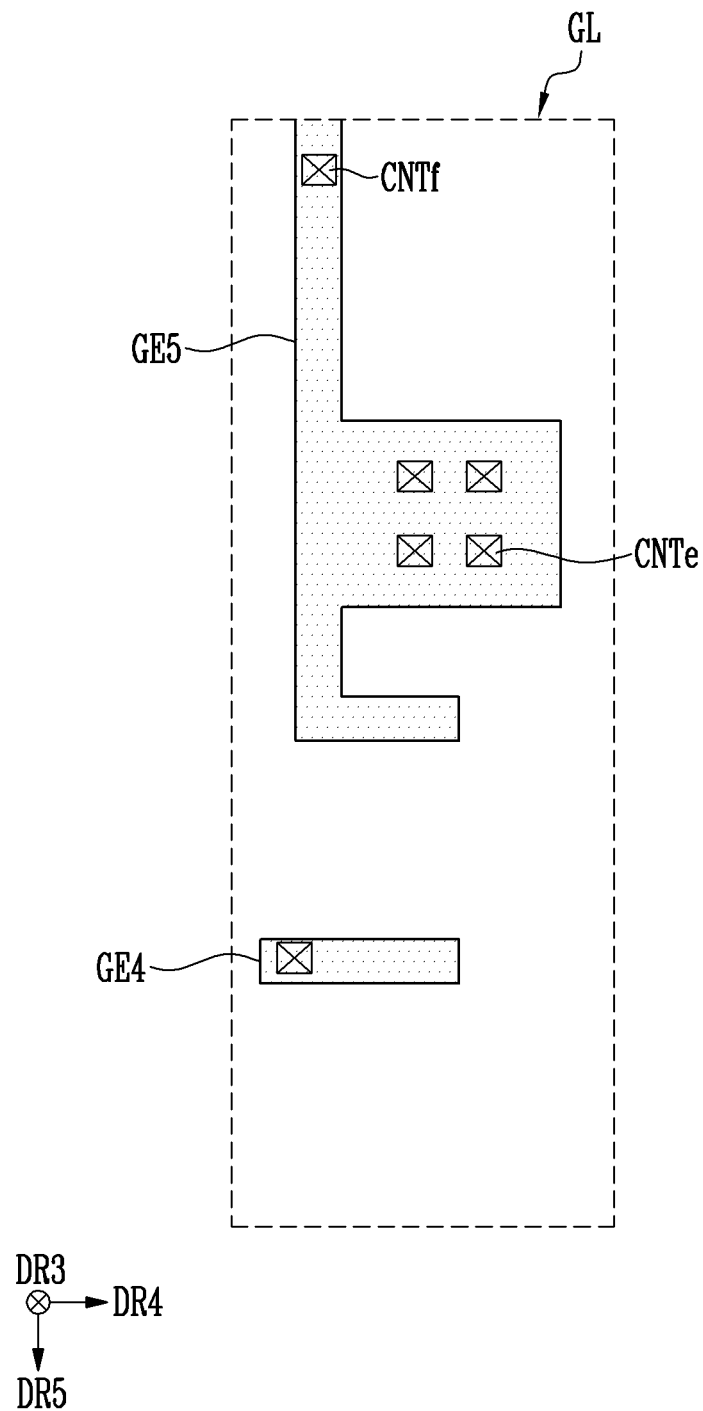
FIG. 4 is a layout diagram schematically illustrating one conductive layer of FIG. 2.
Figure 5:
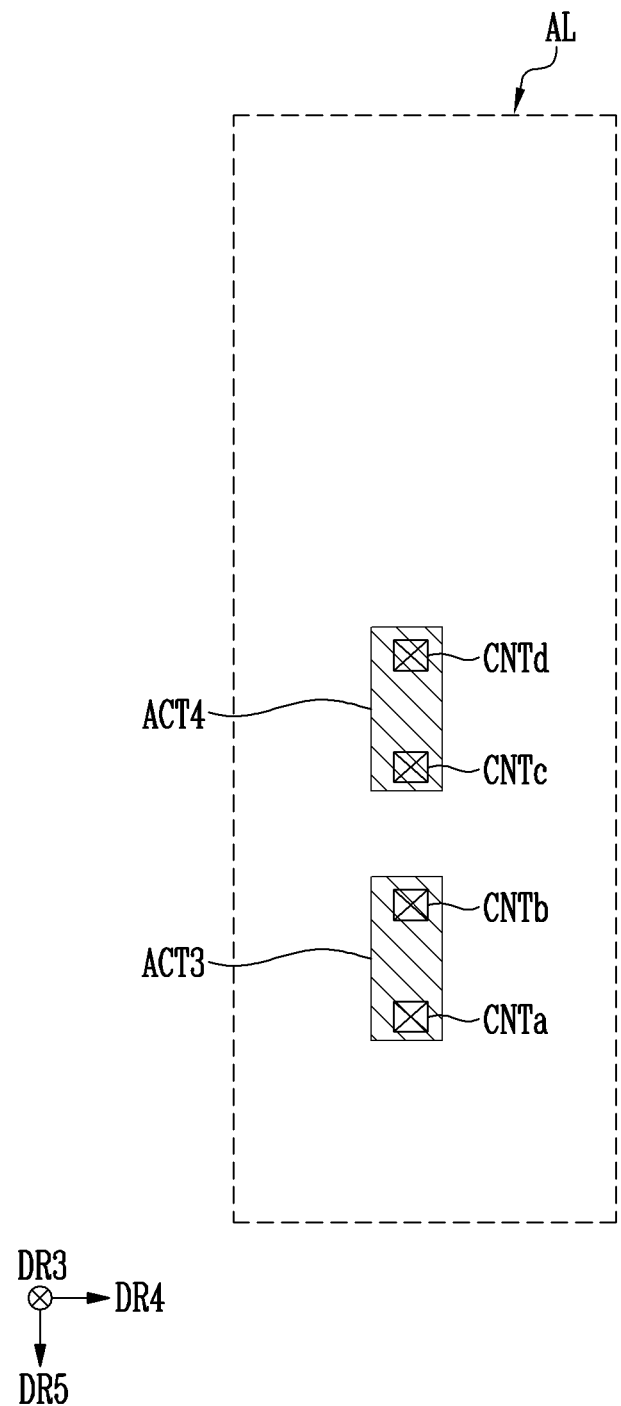
FIG. 5 is a layout diagram schematically illustrating one panel semiconductor layer of FIG. 2.
Figure 6:
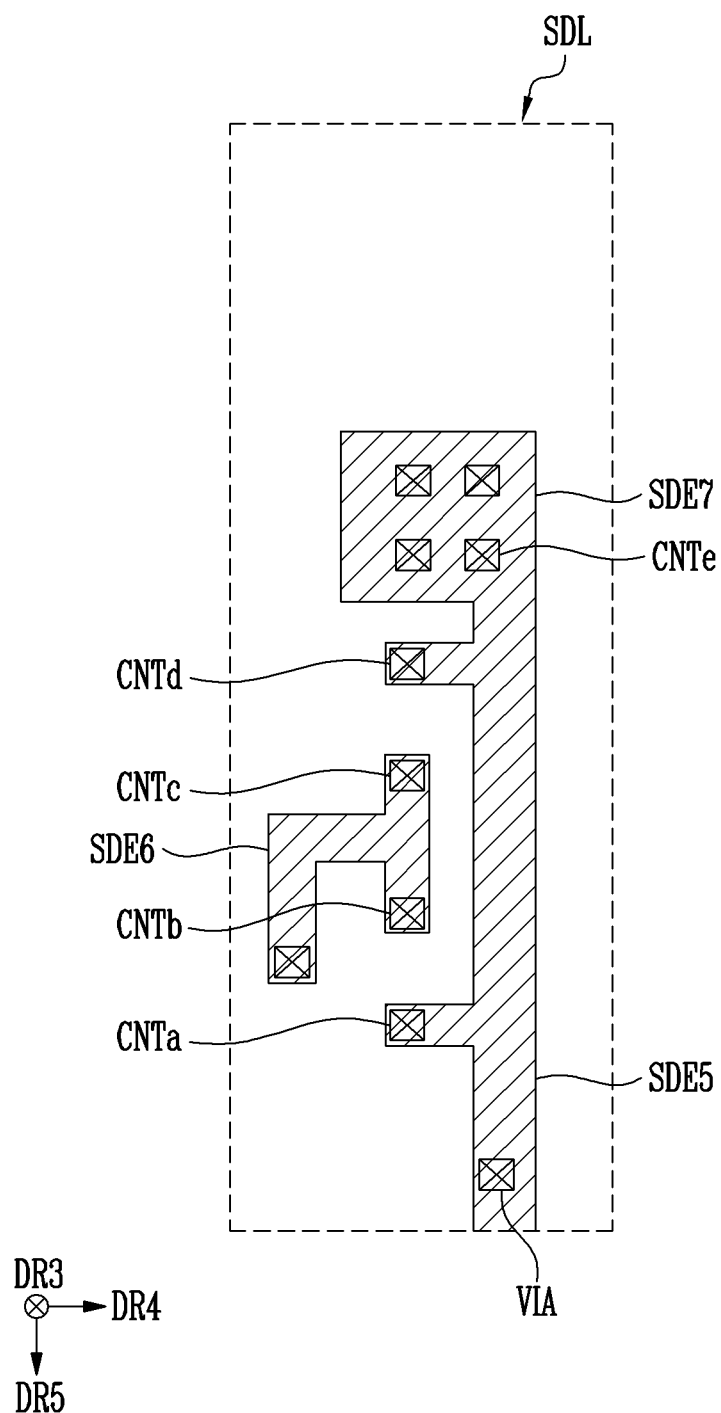
FIG. 6 is a layout diagram schematically illustrating another conductive layer of FIG. 2.

FIG. 2 is a layout diagram schematically illustrating electrostatic diodes in a display device according to an embodiment of the disclosure. FIG. 3 is a schematic cross-sectional view of a display device schematically illustrating a portion corresponding to line I-I' of FIG. 2. FIG. 4 is a layout diagram schematically illustrating one conductive layer of FIG. 2. FIG. 5 is a layout diagram schematically illustrating one panel semiconductor layer of FIG. 2. FIG. 6 is a layout diagram schematically illustrating another conductive layer of FIG. 2.

Hereinafter, 'disposed on a front surface' means disposed (stacked) in a thickness direction or the display direction (third direction DR3), 'disposed on a rear surface' means disposed (stacked) in a direction opposite to the thickness direction or the display direction (direction opposite to the third direction DR3). For example, 'disposed on the front surface' and 'disposed on the rear surface' may be understood as being disposed in a relative stack direction (opposite direction). A plane defined by the first direction DR1 and the second direction DR2 may be equally defined by a fourth direction DR4 and a fifth direction DR5 intersecting the fourth direction DR4. The fourth direction DR4 and the fifth direction DR5 may be identical to or different from the first direction DR1 and the second direction DR2, respectively. A layout shown in FIG. 2 is a view from a lower portion of the display device 1 in the third direction DR3. In FIGS. 4 to 6, positions on a plane where contact holes CNTa to CNTf and a via holes VIA are formed are indicated by a dotted line so that a relative position between each element may be understood.

Referring to FIGS. 2 and 3, a base layer SUB may configure a base member of the display device 1.

According to an embodiment, the base layer SUB may be a rigid substrate or a flexible substrate, and a material or a property thereof is not particularly limited. For example, the base layer SUB may be a rigid substrate formed of glass or tempered glass, or a flexible substrate formed of a thin film of a plastic or metal material. The base layer SUB may be a transparent substrate, but is not limited thereto. For example, the base layer SUB may be a translucent substrate, an opaque substrate, or a reflective substrate. The base layer SUB may include quartz, synthetic quartz, calcium fluoride, quartz doped with fluorine (F-doped quartz), sodalime glass, non-alkali glass, polyethersulphone (PES), polyacrylate (PA), polyarylate (PAR), polyetherimide (PEI), polyethylenenapthalate (PEN), polyethyleneterephthalate (PET), polyphenylenesulfide (PPS), polyallylate, polyimide (PI), polycarbonate (PC), cellulose triacetate (CAT), cellulose acetate propionate (CAP), or a combination thereof.

An area on a front surface of the base layer SUB may be defined as the display area DA so that the pixels PX are disposed, and a remaining area may be defined as the non-display area NDA. In the area on the front surface of the base layer SUB, an emission area EMA may be defined by the pixels PX, and the emission area EMA may be included in the display area DA.

A first buffer layer 111 may be disposed on the front surface of the base layer SUB. The first buffer layer 111 may planarize the front surface of the base layer SUB and may prevent penetration of moisture or external air. The first buffer layer 111 may be an inorganic layer. The first buffer layer 111 may be configured as a single layer or multiple layers. According to an embodiment, the first buffer layer 111 may be omitted.

Multiple transistors Tdr and Tsw may be disposed on a front surface of the first buffer layer 111. Each of the transistors Tdr and Tsw may be a thin film transistor. The transistors Tdr and Tsw shown in FIG. 3 may be a driving transistor and a switch transistor, respectively.

The respective transistors Tdr and Tsw may include semiconductor patterns ACT1 and ACT2, gate electrodes GE1 and GE2, source electrodes SDE2 and SDE4, and drain electrodes SDE1 and SDE3, respectively. For example, the first transistor Tdr which is the driving transistor may include a first semiconductor pattern ACT1, a first gate electrode GE1, a first source electrode SDE2, and a first drain electrode SDE1. The second transistor Tsw which is a switch transistor may include a second semiconductor pattern ACT2, a second gate electrode GE2, a second source electrode SDE4, and a second drain electrode SDE3.

For example, a first panel semiconductor layer may be disposed on the front surface of the first buffer layer 111. The first panel semiconductor layer may include the first semiconductor pattern ACT1 and the second semiconductor pattern ACT2 described above.

According to an embodiment, at least a portion of the first semiconductor pattern ACT1 and the second semiconductor pattern ACT2 may be a pattern formed separately from each other. According to an embodiment, the first semiconductor pattern ACT1 and the second semiconductor pattern ACT2 may be integral with each other.

As an embodiment, the first panel semiconductor layer may include amorphous silicon, poly silicon, low temperature poly silicon, or an organic semiconductor. In another embodiment, the first panel semiconductor layer may be an oxide semiconductor. The oxide semiconductor may include a metal oxide including zinc (Zn), indium (In), gallium (Ga), tin (Sn), or titanium (Ti), or a combination of a metal such as zinc (Zn), indium (In), gallium (Ga), tin (Sn), or titanium (Ti) and an oxide thereof. For example, the oxide semiconductor may include at least one of zinc oxide (ZnO), zinc-tin oxide (ZTO), zinc-indium oxide (ZIO), indium oxide ($In_2O_3$), titanium oxide (TiO), indium-gallium-zinc oxide (IGZO), and indium-zinc-tin oxide (IZTO). Although not clearly shown, each of the semiconductor patterns ACT1 and ACT2 of the first panel semiconductor layer may include a channel area, and a source area and a drain area disposed on both sides of the channel area and doped with an impurity.

A first gate insulating layer 112 may be disposed on a front surface of the first panel semiconductor layer. The first gate insulating layer 112 may include an inorganic insulating material such as aluminum oxide ($AlO_x$), silicon oxide ($SiO_x$), silicon nitride ($SiN_x$), silicon oxynitride ($SiO_xN_y$), silicon carbide ($SiC_x$), titanium oxide ($TiO_x$), zirconium oxide ($ZrO_x$), or zinc oxide ($ZnO_x$), or an organic insulating material such as epoxy, polyimide, polyethylene terephthalate, polycarbonate, polyethylene, or polyacrylate. The first gate insulating layer 112 may be configured as a single layer or multiple layers.

A first conductive layer may be disposed on a front surface of the first gate insulating layer 112. The first conductive layer may include a first gate electrode GE1, a second gate electrode GE2, and a first connection electrode CE1. The first connection electrode CE1 may be an electrode electrically connected to a first electrostatic diode 401 to be described later. The first conductive layer may further include a first capacitor pattern CSE1.

The first conductive layer may be formed of a metal having a conductivity. For example, the first conductive layer may include molybdenum (Mo), aluminum (Al), copper (Cu), titanium (Ti), or a combination thereof. The first conductive layer may be configured as a single layer or multiple layers.

A second gate insulating layer 113 may be disposed on a front surface of the first conductive layer. The second gate insulating layer 113 may include the inorganic insulating material or the organic insulating material that may be used for the first gate insulating layer 112. The second gate insulating layer 113 may be configured as a single layer or multiple layers.

A second conductive layer may be disposed on a front surface of the second gate insulating layer 113. The second conductive layer may include a third gate electrode GE3 and a second connection electrode CE2. The second connection electrode CE2 may contact the first connection electrode CE1 through a contact hole formed in the second gate insulating layer 113. The second connection electrode CE2 may be an electrode electrically connected to the first electrostatic diode 401 to be described later. The third gate electrode GE3 may be a gate electrode of another transistor which is not shown, a power line, or a signal line, or may form a capacitor with another electrode. The second conductive layer may be formed of a metal having a conductivity. For example, the second conductive layer may include molybdenum (Mo), aluminum (Al), copper (Cu), and titanium (Ti). The second conductive layer may be configured as a single layer or multiple layers.

A first interlayer insulating layer 114 may be disposed on a front surface of the second conductive layer. The first interlayer insulating layer 114 may include the inorganic insulating material or the organic insulating material that may be used for the first gate insulating layer 112. The first interlayer insulating layer 114 may be configured as a single layer or multiple layers.

A third conductive layer may be disposed on a front surface of the first interlayer insulating layer 114. The third conductive layer may include the source electrodes SDE2 and SDE4 and the drain electrodes SDE1 and SDE3 described above, and a third connection electrode CE3. The third connection electrode CE3 may contact the second connection electrode CE2 through a contact hole formed in the first interlayer insulating layer 114. The third connection electrode CE3 may be an electrode electrically connected to the first electrostatic diode 401 to be described later. The third conductive layer may further include a second capacitor pattern CSE2. The second capacitor pattern CSE2 may configure a storage capacitor together with the first capacitor pattern CSE1.

The third conductive layer may be formed of a metal having a conductivity. For example, the source electrodes SDE2 and SDE4 and the drain electrodes SDE1 and SDE3 may include aluminum (Al), copper (Cu), titanium (Ti), or molybdenum (Mo).

The source electrodes SDE2 and SDE4 and the drain electrodes SDE1 and SDE3 are not limited to names. In another embodiment, according to a material of the first semiconductor pattern ACT1 and the second semiconductor pattern ACT2, the shown source electrodes SDE2 and SDE4 may function as drain electrodes, or the shown drain electrode SDE1 and SDE3 may function as source electrodes.

The source electrodes SDE2 and SDE4 and the drain electrodes SDE1 and SDE3 may be electrically connected to the source area and the drain area of each of the corresponding semiconductor patterns ACT1 and ACT2 through a contact hole passing through the first interlayer insulating layer 114, the second gate insulating layer 113, and the first gate insulating layer 112.

A passivation layer 115 may be disposed on a front surface of the third conductive layer. The passivation layer 115 may be disposed to cover a circuit portion including the transistors Tdr and Tsw. The passivation layer 115 may also be disposed on at least a portion of the non-display area NDA. The passivation layer 115 may include $SiO_x$, $SiN_x$, or the like.

A first protective layer 121 may be disposed on a front surface of the passivation layer 115. As an embodiment, the first protective layer 121 may be a planarization layer. The first protective layer 121 may include a material such as acryl or polyimide. A front surface of the first protective layer 121 may be flat.

A fourth conductive layer may be disposed on a front surface of the first protective layer 121. The fourth conductive layer may include various conductive patterns such as a power line, a signal line, and a connection electrode. For example, the fourth conductive layer may include a fifth connection electrode CE5. The fifth connection electrode CE5 may be a power line, a signal line, or a connection electrode that electrically connects the first transistor Tdr and the light emitting element LD.

According to an embodiment, the fourth conductive layer may include a low power pattern VSSL. The low power pattern VSSL may be electrically connected to a power line through which a low voltage signal is provided. According to an embodiment, the low power pattern VSSL may be positioned at a position that does not overlap the first capacitor pattern CSE1 and the second capacitor pattern CSE2, but the disclosure is not limited thereto.

According to an embodiment, the fourth conductive layer may include a fourth connection electrode CE4. The fourth connection electrode CE4 may contact the third connection electrode CE3 through a contact hole formed in the first protective layer 121. The fourth connection electrode CE4 may be an electrode electrically connected to the first electrostatic diode 401 to be described later. In some other embodiments, at least one of the second connection electrode CE2, the third connection electrode CE3, and the fourth connection electrode CE4 may be omitted.

The fourth conductive layer may be formed of a metal having a conductivity. For example, the fourth conductive layer may include aluminum (Al), copper (Cu), titanium (Ti), or molybdenum (Mo).

The fifth connection electrode CE5 may contact one of the source electrode SDE2 and the drain electrode SDE1 of the first transistor Tdr through a contact hole passing through the first protective layer 121.

A second protective layer 122 may be disposed on a front surface of the fourth conductive layer. The second protective layer 122 may be a passivation layer or a planarization layer. The passivation layer may include $SiO_x$, $SiN_x$, or the like, and the planarization layer may include a material such as acryl or polyimide. The second protective layer 122 may include both of the passivation layer and the planarization layer.

The second protective layer 122 may include a contact hole exposing an upper portion of a portion of a member included in the fourth conductive layer. For example, the second protective layer 122 may include a contact hole exposing at least a portion of the fifth connection electrode CE5.

In the specification, the first buffer layer 111 to the second protective layer 122 including the first transistor Tdr and the second transistor Tsw may be referred to as a pixel circuit layer PCL.

As an embodiment, based on the display area DA, the display device 1 may include first and second partition walls or banks PW1 and PW2, first and second electrodes ETL1 and ETL2, a first insulating layer 131, a bank BNK, light emitting elements LD, first and second contact electrodes CNE1 and CNE2, a second insulating layer 132, a third insulating layer 133, a fourth insulating layer 141, and a thin film encapsulation layer 151 sequentially disposed on a front surface of the pixel circuit layer PCL. Although it is illustrated that the above-described elements are directly and sequentially disposed on a front surface of the second protective layer 122 in the drawing, some elements may be omitted or another element may be further disposed between other elements.

The first and second banks PW1 and PW2 may be disposed on the front surface of the pixel circuit layer PCL (for example, the second protective layer 122). The first and second banks PW1 and PW2 may protrude in a thickness direction (for example, the third direction DR3) on the front surface of the pixel circuit layer PCL. According to an embodiment, the first and second banks PW1 and PW2 may have substantially the same protrusion height, but are not limited thereto. For example, each of protrusion heights of the first and second banks PW1 and PW2 may be in a range of about 1.0 μm to 1.5 μm.

As an embodiment, the first bank PW1 may be disposed between the pixel circuit layer PCL and the first electrode ETL1. The second bank PW2 may be disposed between the pixel circuit layer PCL and the second electrode ETL2.

According to an embodiment, the first and second banks PW1 and PW2 may have various shapes. For example, the first and second banks PW1 and PW2 may have a trapezoidal cross-sectional shape in which a width becomes narrower toward an upper portion as shown in the drawing. Each of the first and second banks PW1 and PW2 may have an inclined surface on at least one side surface.

Although not shown, in another example, the first and second banks PW1 and PW2 may have a semi-circular or semi-elliptical cross-sectional shape in which a width becomes narrower toward an upper portion. Each of the first and second banks PW1 and PW2 may have a curved surface on at least one side surface. However, a shape of the first and second banks PW1 and PW2 is not particularly limited, and may be variously changed. According to an embodiment, at least one of the first and second banks PW1 and PW2 may be omitted or a position thereof may be changed.

The first and second banks PW1 and PW2 may include an insulating material including an inorganic material and/or an organic material. For example, the first and second banks PW1 and PW2 may include at least one layer of inorganic layer including various inorganic insulating materials including $SiN_x$ or $SiO_x$. In another example, the first and second banks PW1 and PW2 may include at least one layer of organic layer, photoresist layer, and the like including various organic insulating materials, or may be configured as an insulator of a single layer or multiple layers including organic and inorganic materials. However, the disclosure is not limited thereto, and a material of the first and second banks PW1 and PW2 may be variously changed.

In an embodiment, the first and second banks PW1 and PW2 may function as a reflective member. For example, the first and second banks PW1 and PW2 may function as a reflective member that guides light emitted from each of the light emitting elements LD in a desired direction to improve light efficiency of the pixel PX together with the first and second electrodes ETL1 and ETL2 provided thereon.

The first and second electrodes ETL1 and ETL2 may be disposed on the first and second banks PW1 and PW2, respectively. The first and second electrodes ETL1 and ETL2 may be disposed to be spaced apart from each other. The first and second electrodes ETL1 and ETL2 may be formed on the same layer.

As an embodiment, the first and second electrodes ETL1 and ETL2, or the like disposed on the first and second banks PW1 and PW2, respectively, may have a shape corresponding to a shape of each of the first and second banks PW1 and PW2. For example, each of the first and second electrodes ETL1 and ETL2 may have an inclined surface or a curved surface corresponding to the first and second banks PW1 and PW2 and may protrude in the thickness direction of the display device 1.

Each of the first and second electrodes ETL1 and ETL2 may include at least one conductive material. For an example, each of the first and second electrodes ETL1 and ETL2 may include at least one material among a metal such as Ag, Mg, Al, Pt, Pd, Au, Ni, Nd, Ir, Cr, Ti, and an alloy thereof, a conductive oxide such as ITO, IZO, ZnO, and ITZO, and a conductive polymer such as PEDOT, but is not limited thereto.

Each of the first and second electrodes ETL1 and ETL2 may be configured as a single layer or multiple layers. For example, each of the first and second electrodes ETL1 and ETL2 may include at least one layer of reflective electrode layer. Each of the first and second electrodes ETL1 and ETL2 may include at least one of at least one layer of transparent electrode layer disposed on and/or under the reflective electrode layer, and at least one layer of conductive capping layer covering an upper portion of the reflective electrode layer and/or the transparent electrode layer.

According to an embodiment, the reflective electrode layer of each of the first and second electrodes ETL1 and ETL2 may be formed of an electrode material having a uniform reflectance. For example, the reflective electrode layer may include at least one of metals such as Ag, Mg, Al, Pt, Pd, Au, Ni, Nd, Ir, Cr, Ti, and an alloy thereof, but is not limited thereto. However, the disclosure is limited thereto, and the reflective electrode layer may be formed of various reflective electrode materials. In case that each of the first and second electrodes ETL1 and ETL2 includes the reflective electrode layer, light emitted from the both ends of each of the light emitting elements LD, for example, the ends and another ends, may be allowed to further proceed in a display direction (for example, the third direction DR3, or a front direction). In particular, in case that the first and second electrodes ETL1 and ETL2 are disposed to face the one ends and the another ends of the light emitting elements LD while having the inclined surface or the curved surface corresponding to the shape of the first and second banks PW1 and PW2, the light emitted from the one ends and the another ends of each of the light emitting elements LD may be reflected by the first and second electrodes ETL1 and ETL2 and may further proceed in the display direction (third direction DR3) of the display device 1. Accordingly, efficiency of the light emitted from the light emitting elements LD may be improved.

The transparent electrode layer of each of the first and second electrodes ETL1 and ETL2 may be formed of various transparent electrode materials. For example, the transparent electrode layer may include ITO, IZO, or ITZO, but is not limited thereto. In an embodiment, each of the first and second electrodes ETL1 and ETL2 may be configured as triple layers having a stack structure of ITO/Ag/ITO. As described above, in case that the first and second electrodes ETL1 and ETL2 are configured as multiple layers of two or more layers, a voltage drop due to a signal delay (RC delay) may be minimized. Accordingly, a desired voltage may be effectively transmitted to the light emitting elements LD.

In case that each of the first and second electrodes ETL1 and ETL2 includes the conductive capping layer that covers the reflective electrode layer and/or the transparent electrode layer, the reflective electrode layer or the like of the first and second electrodes ETL1 and ETL2 may be prevented from being damaged due to a defect occurring in a manufacturing process or the like of the pixel PX. However, the conductive capping layer may be omitted according to an embodiment. The conductive capping layer may be regarded as a component of each of the first and second electrodes ETL1 and ETL2 or may be regarded as a separate component disposed on a front surface of the first and second electrodes ETL1 and ETL2.

As an embodiment, the second electrode ETL2 may overlap at least a portion of the fifth connection electrode CE5 in the third direction DR3. The second electrode ETL2 may contact the fifth connection electrode CE5 through a contact hole passing through the second protective layer 122. According to an embodiment, the second electrode ETL2 may be an anode electrode to which a high voltage signal is provided.

Although not clearly shown in the drawings, the first electrode ETL1 may contact the low power pattern VSSL through a contact hole passing through the second protective layer 122. According to an embodiment, the first electrode ETL1 may be a cathode to which a low voltage signal is provided.

In the display area DA, the first insulating layer 131 may be disposed on a front surface of an area of the first and second electrodes ETL1 and ETL2. For example, the first insulating layer 131 may include an opening formed to cover an area of the first and second electrodes ETL1 and ETL2 and exposing another area of the first and second electrodes ETL1 and ETL2.

For example, the first insulating layer 131 may be disposed between the first and second electrodes ETL1 and ETL2 and the light emitting elements LD, and may expose at least an area of each of the first and second electrodes ETL1 and ETL2. The first insulating layer 131 may be formed to cover the first and second electrodes ETL1 and ETL2 after the first and second electrodes ETL1 and ETL2 are formed, and thus the first and second electrodes ETL1 and ETL2 may be prevented from being damaged or metal may be prevented from precipitating in a subsequent process. The first insulating layer 131 may stably support each light emitting element LD. According to an embodiment, the first insulating layer 131 may be omitted.

The light emitting elements LD may be supplied and aligned on a front surface of an area where the first insulating layer 131 is disposed between the first and second electrodes ETL1 and ETL2. For example, the light emitting elements LD may be supplied by an inkjet method or the like, and the light emitting elements LD may be aligned between the first and second electrodes ETL1 and ETL2 by an alignment voltage (or alignment signal) applied to the first and second electrodes ETL1 and ETL2. An ink used in the inkjet method may include a solvent and the light emitting elements LD.

A bank BNK may be disposed on a front surface of the first insulating layer 131. For example, the bank BNK may be formed between the pixels to surround the pixel to configure a pixel defining layer that partitions the emission area. According to an embodiment, a height of the bank BNK may be greater than a height of the banks PW1 and PW2.

According to an embodiment, the bank BNK may not be disposed in the same pixel. According to an embodiment, the bank BNK may be omitted.

Each of the light emitting elements LD may be electrically connected between the first and second electrodes ETL1 and ETL2. For example, a first end of each of the light emitting elements LD may be electrically connected to the first electrode ETL1, and a second end of each of the light emitting elements LD may be electrically connected to the second electrode ETL2. The light emitting element LD is described later with the following drawings (FIGS. 7 to 13).

In an embodiment, the first end of each of the light emitting elements LD may not be directly disposed on a front surface of the first electrode ETL1, and may be electrically connected to the first electrode ETL1 through at least one contact electrode, for example, the first contact electrode CNE1. However, the disclosure is not limited thereto. For example, in another embodiment of the disclosure, the first end of the light emitting elements LD may be in direct contact with the first electrode ETL1 to be electrically connected to the first electrode ETL1.

Similarly, the second end of each of the light emitting elements LD may not be directly disposed on a front surface of the second electrode ETL2, and may be electrically connected to the second electrode ETL2 through at least one contact electrode, for example, the second contact electrode CNE2. However, the disclosure is not limited thereto. For example, in another embodiment of the disclosure, the second end of each of the light emitting elements LD may be in direct contact with the second electrode ETL2 to be electrically connected to the second electrode ETL2.

The second insulating layer 132 may be disposed on the light emitting elements LD, for example, the light emitting elements LD aligned between the first and second electrodes ETL1 and ETL2, and may expose the first and second ends of the light emitting elements LD. For example, the second insulating layer 132 may not cover the first and second ends of the light emitting elements LD and may be disposed on a portion of the light emitting elements LD. The second insulating layer 132 may be formed in an independent pattern on an entire surface of each emission area EMA, but is not limited thereto. As shown in FIG. 3, in case that a separation space exists between the first insulating layer 131 and the light emitting elements LD before formation of the second insulating layer 132, the separation space may be filled with the second insulating layer 132. Accordingly, the light emitting elements LD may be more stably supported.

The third insulating layer 133 may be formed to cover a portion of one of the first contact electrode CNE1 and the second contact electrode CNE2. As an embodiment, the first contact electrode CNE1 and the second contact electrode CNE2 may be formed on different layers. For example, the third insulating layer 133 may be disposed to cover the second contact electrode CNE2, and the first contact electrode CNE1 may be disposed on a front surface of the third insulating layer 133. However, the disclosure is not limited thereto, and the third insulating layer 133 may be disposed to cover the first contact electrode CNE1, and the second contact electrode CNE2 may be disposed on a front surface of the third insulating layer 133. In another embodiment, the third insulating layer 133 may be omitted, and the first contact electrode CNE1 and the second contact electrode CNE2 may be formed on the same layer.

The fourth insulating layer 141 may be formed and/or disposed on a front surface of an area on the first and second banks PW1 and PW2, the first and second electrodes ETL1 and ETL2, the light emitting elements LD, the first and second contact electrodes CNE1 and CNE2, and the bank BNK are positioned to cover the first and second banks PW1 and PW2, the first and second electrodes ETL1 and ETL2, the light emitting elements LD, the first and second contact electrodes CNE1 and CNE2, and the bank BNK.

The thin film encapsulation layer 151 including at least one layer of inorganic layer and/or organic layer may be disposed on a front surface of the fourth insulating layer 141. According to an embodiment, at least one layer of overcoat layer (not shown) may be disposed on the fourth insulating layer 141.

In the specification, the first and second banks PW1 and PW2 to the thin film encapsulation layer 151 may be referred to as a pixel emission layer PEL. For example, the pixel emission layer PEL may be disposed on a front surface of the pixel circuit layer PCL. Elements disposed on a rear surface of the base layer SUB will be described.

An antistatic circuit layer EPL including at least one electrostatic diode may be disposed on the rear surface of the base layer SUB. As an embodiment, each electrostatic diode may be configured with one or more thin film transistors. For example, each of a first electrostatic diode 401 and a second electrostatic diode 402 may have a form of a diode-connected thin film transistor. However, a form of the electrostatic diode is not limited thereto. For example, the electrostatic diode may be configured of a diode, a capacitor, or the like.

As an embodiment, the antistatic circuit layer EPL may include the first electrostatic diode 401 and the second electrostatic diode 402 connected in series.

The first electrostatic diode 401 and the second electrostatic diode 402 may be disposed between the driver IC (integrated circuit) 300 and the pixel circuit layer PCL.

The first electrostatic diode 401 and the second electrostatic diode 402 may block static electricity flowing into the elements disposed in the pixel circuit layer PCL. According to an embodiment, the first electrostatic diode 401 and the second electrostatic diode 402 may configure a bidirectional diode. Each of the first electrostatic diode 401 and the second electrostatic diode 402 may be configured with two diode connected transistor pair connected in opposite directions (a forward direction and a reverse direction) between the driver IC 300 and the pixel circuit layer PCL.

The antistatic circuit layer EPL may include a second buffer layer 211, a fifth conductive layer GL (FIG. 4), a second panel semiconductor layer AL (FIG. 5), a sixth conductive layer SDL (FIG. 6), and insulating layers each disposed between the second buffer layer 211, the fifth conductive layer GL, the second panel semiconductor layer AL, and the sixth conductive layer SDL. Although it is shown that the above-described elements are directly and sequentially disposed on the rear surface of the base layer SUB in the drawing, some elements may be omitted or another element may be further disposed between some elements.

The second buffer layer 211 may be disposed on the rear surface of the base layer SUB. The second buffer layer 211 may planarize the rear surface of the base layer SUB and may prevent penetration of moisture or external air. The second buffer layer 211 may be an inorganic layer. The second buffer layer 211 may be configured as a single layer or multiple layers. According to an embodiment, the second buffer layer 211 may be omitted.

At least one electrostatic diode may be disposed on a rear surface of the second buffer layer 211. In the drawing, the embodiment is illustrated as including the first electrostatic diode 401 and the second electrostatic diode 402 having a thin film transistor shape, but the disclosure is not limited.

Referring to FIG. 4 together with FIG. 3, each of the first electrostatic diode 401 and the second electrostatic diode 402 may include gate electrodes GE4 and GE5, semiconductor patterns ACT3 and ACT4, and source/drain electrodes SDE5, SDE6, and SDE7, respectively. For example, the first electrostatic diode 401 may include a third semiconductor pattern ACT3, a fourth gate electrode GE4, a first source/drain electrode SDE5, and a second source/drain electrode SDE6. The second electrostatic diode 402 may include a fourth semiconductor pattern ACT4, a fifth gate electrode GE5, a second source/drain electrode SDE6, and a third source/drain electrode SDE7. Here, among the two source/drain electrodes of each electrostatic diode, one of the source/drain electrode may be a source electrode, and another one of the source/drain electrode may be a drain electrode. The second source/drain electrode SDE6 may be an electrode electrically shared by the first electrostatic diode 401 and the second electrostatic diode 402.

As an embodiment, the first source/drain electrode SDE5 and the third source/drain electrode SDE7 may be electrically connected to each other. For example, the first source/drain electrode SDE5 and the third source/drain electrode SDE7 may correspond to different areas within the same electrode pattern. However, the disclosure is not limited thereto, and in another embodiment, the first source/drain electrode SDE5 and the third source/drain electrode SDE7 may be electrode patterns separated from each other.

The fifth conductive layer GL may be disposed on a rear surface of the second buffer layer 211. The fifth conductive layer GL may include the fourth gate electrode GE4 and the fifth gate electrode GE5. The fifth conductive layer GL may be formed of a metal having a conductivity. For example, the fifth conductive layer GL may include a metal such as molybdenum (Mo), aluminum (Al), copper (Cu), or titanium (Ti). The fifth conductive layer GL may be configured as a single layer or multiple layers.

As an embodiment, each of the fourth gate electrode GE4 and the fifth gate electrode GE5 may be separate electrode patterns. An electrical signal may be provided to the fifth gate electrode GE5 from the driver IC (integrated circuit) 300.

A third gate insulating layer 212 may be disposed on a rear surface of the fifth conductive layer GL. The third gate insulating layer 212 may include an inorganic insulating material or an organic insulating material such as aluminum oxide ($AlO_x$), silicon oxide ($SiO_x$), silicon nitride ($SiN_x$), silicon oxynitride ($SiO_xN_y$), silicon carbide ($SiC_x$), titanium oxide ($TiO_x$), zirconium oxide ($ZrO_x$), or zinc oxide ($ZnO_x$). The third gate insulating layer 212 may be configured as a single layer or multiple layers.

Referring to FIG. 5 together with FIG. 3, the second panel semiconductor layer AL may be disposed on the third gate insulating layer 212. The second panel semiconductor layer AL may include the third semiconductor pattern ACT3 and the fourth semiconductor pattern ACT4.

As an embodiment, the third semiconductor pattern ACT3 and the fourth semiconductor pattern ACT4 may be separately formed patterns. The third semiconductor pattern ACT3 may include an area overlapping the fourth gate electrode GE4 in the thickness direction, and the fourth semiconductor pattern ACT4 may include an area overlapping the fifth gate electrode GE5 in the thickness direction.

As an embodiment, the second panel semiconductor layer AL may include amorphous silicon, poly silicon, low temperature poly silicon, or an organic semiconductor. In another embodiment, the second panel semiconductor layer AL may be an oxide semiconductor. The oxide semiconductor may include a metal oxide including zinc (Zn), indium (In), gallium (Ga), tin (Sn), or titanium (Ti), or a combination of a metal such as zinc (Zn), indium (In), gallium (Ga), tin (Sn), or titanium (Ti) and an oxide thereof. For example, the oxide semiconductor may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). Although not clearly shown, each of the third semiconductor pattern ACT3 and the fourth semiconductor pattern ACT4 may include a channel area, and a source area and a drain area disposed on both sides of the channel area and doped with an impurity.

A second interlayer insulating layer 213 may be disposed on a rear surface of the second panel semiconductor layer AL. The second interlayer insulating layer 213 may include an inorganic insulating material or an organic insulating material such as aluminum oxide ($AlO_x$), silicon oxide ($SiO_x$), silicon nitride ($SiN_x$), silicon oxynitride ($SiO_xN_y$), silicon carbide ($SiC_x$), titanium oxide ($TiO_x$), zirconium oxide ($ZrO_x$), or zinc oxide ($ZnO_x$).

Referring to FIG. 6 together with FIG. 3, a sixth conductive layer SDL may be disposed on a rear surface of the second interlayer insulating layer 213. The sixth conductive layer SDL may include the source/drain electrodes SDE5, SDE6, and SDE7. The sixth conductive layer SDL may be formed of a metal having a conductivity. For example, the sixth conductive layer SDL may include a metal such as aluminum (Al), copper (Cu), titanium (Ti), or molybdenum (Mo).

As an embodiment, the first electrostatic diode 401 and the second electrostatic diode 402 may be of a bottom gate type in which a gate electrode, a semiconductor pattern, and a source/drain electrode are sequentially stacked. However, those skilled in the art will readily understand that at least one of the first electrostatic diode 401 and the second electrostatic diode 402 may be formed as a top gate type in which a semiconductor pattern, a gate electrode, and a source/drain electrode are sequentially stacked.

The first source/drain electrode SDE5 may contact the source area or the drain area of the third semiconductor pattern ACT3 through a contact hole CNTa passing through the second interlayer insulating layer 213. The first source/drain electrode SDE5 may contact the first connection electrode CE1 through a via hole VIA passing through the second interlayer insulating layer 213, the third gate insulating layer 212, the second buffer layer 211, the base layer SUB, the first buffer layer 111, and the first gate insulating layer 112. The via hole VIA may be formed in the display area DA or the non-display area NDA. The via hole VIA may include an area passing through the front surface and the rear surface of the base layer SUB.

The second source/drain electrode SDE6 may contact the source area or the drain area of the third semiconductor pattern ACT3 through a contact hole CNTb passing through the second interlayer insulating layer 213, and may contact the source area or the drain area of the fourth semiconductor pattern ACT4 through another contact hole CNTc passing through the second interlayer insulating layer 213.

The third source/drain electrode SDE7 may contact the source area or the drain area of the fourth semiconductor pattern ACT4 through a contact hole CNTd passing through the second interlayer insulating layer 213, and may be contact the fifth gate electrode GE5 through another contact hole CNTe passing through the second interlayer insulating layer 213 and the third gate insulating layer 212.

A third protective layer 214 may be disposed on a rear surface of the sixth conductive layer SDL. The third protective layer 214 may be disposed to cover a circuit portion including the first electrostatic diode 401 and the second electrostatic diode 402. The third protective layer 214 may also be disposed on at least a portion of the non-display area NDA. As an embodiment, the third protective layer 214 may be a passivation layer or a planarization layer. The passivation layer may include $SiO_x$, $SiN_x$, or the like, and the planarization layer may include a material such as acryl or polyimide. According to an embodiment, the third protective layer 214 may include both of the passivation layer and the planarization layer. The passivation layer may be disposed on a rear surface of the sixth conductive layer SDL, and the planarization layer may be disposed on a front surface of the passivation layer. A rear surface of the third protective layer 214 may be flat.

The driver IC 300 may be disposed on a rear surface of the antistatic circuit layer EPL. For example, the driver IC 300 may be disposed on the rear surface of the third protective layer 214. A line (or lines) in the driver IC 300 may be electrically connected to the fifth gate electrode GE5 through a contact hole CNTf passing through the third protective layer 214, the second interlayer insulating layer 213, and the third gate insulating layer 212. For example, the line in the driver IC 300 may be electrically connected to the second electrostatic diode 402 overlapping the display area DA through the contact hole CNTf.

At least one of the first electrostatic diode 401 and the second electrostatic diode 402 may be disposed to overlap the display area DA. For example, at least one of the third semiconductor pattern ACT3, the fourth gate electrode GE4, the fourth semiconductor pattern ACT4, and the fifth gate electrode GE5 may overlap the first electrode ETL1, the second electrode ETL2, or the light emitting element LD in the thickness direction. According to an embodiment, at least one of the first electrostatic diode 401 and the second electrostatic diode 402 may be disposed to overlap the emission area EMA.

By forming at least one of the first electrostatic diode 401 and the second electrostatic diode 402 in the display area DA, a width of the non-display area NDA may be minimized. According to an embodiment, a width W_NDA (refer to FIG. 1) of the non-display area NDA in a plan view may be several tens of micrometers to several hundreds of micrometers (for example, 1 mm or less).

The pixel circuit layer PCL may be disposed on the front surface of the base layer SUB, and the pixel emission layer PEL may be disposed on the front surface of the pixel circuit layer PCL. The antistatic circuit layer EPL may be disposed on the rear surface of the base layer SUB. For example, the antistatic circuit layer EPL and the pixel circuit layer PCL may be stacked (disposed) in different directions with respect to the base layer SUB. The pixel circuit layer PCL and the pixel emission layer PEL may be stacked (disposed) in the same direction, and the antistatic circuit layer EPL may be stacked (disposed) in a direction different from a stack direction of the pixel circuit layer PCL and the pixel emission layer PEL with respect to the base layer SUB.

In a method of manufacturing the display device 1, the pixel circuit layer PCL may be first formed, and the antistatic circuit layer EPL may be formed. According to an embodiment, the pixel emission layer PEL may be formed after the pixel circuit layer PCL is formed or after the antistatic circuit layer EPL is formed. The via hole VIA may be formed after the pixel circuit layer PCL is formed, and the antistatic circuit layer EPL may be formed after the via hole VIA is formed.

Although not clearly shown, at least a portion of the base layer SUB and the antistatic circuit layer EPL may include a buffer hole. The buffer hole may prevent the base layer SUB and the antistatic circuit layer EPL from being separated from each other in case that the antistatic circuit layer EPL is formed on the rear surface of the base layer SUB.

The light emitting element LD will be described.

Figure 7:
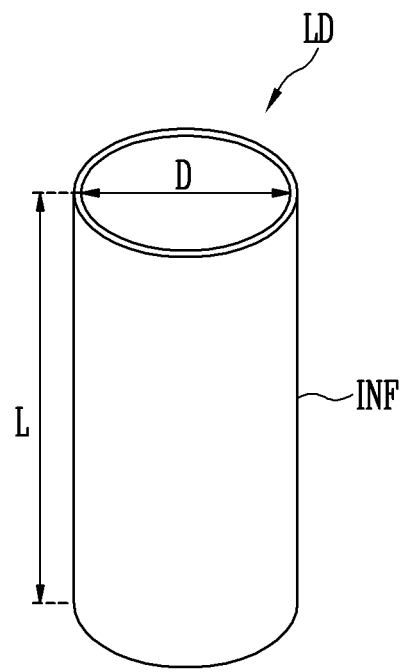
FIGS. 7 and 8 are perspective view and schematic cross-sectional view illustrating a light emitting element according to an embodiment of the disclosure.
Figure 8:
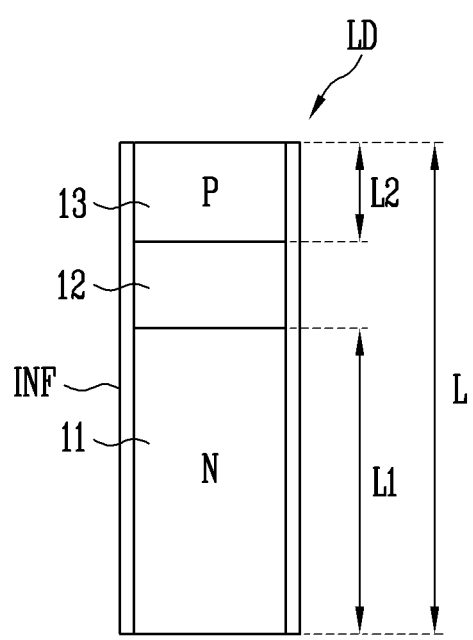

FIGS. 7 and 8 are perspective view and schematic cross-sectional view illustrating a light emitting element according to an embodiment of the disclosure.

Referring to FIGS. 7 and 8, the light emitting element LD may include a first semiconductor layer 11 and a second semiconductor layer 13, and an active layer 12 disposed between the first and second semiconductor layers 11 and 13. For example, the light emitting element LD may be configured as a stack in which the first semiconductor layer 11, the active layer 12, and the second semiconductor layer 13 are sequentially stacked in a direction.

According to an embodiment, the light emitting element LD may be provided in a rod shape extending in a direction. The light emitting element LD may have a side end (first end) and another side end (second end) in the direction.

According to an embodiment, one of the first and second semiconductor layers 11 and 13 may be disposed at the side end of the light emitting element LD, and another one of the first and second semiconductor layers 11 and 13 may be disposed at the another side end of the light emitting element LD.

According to an embodiment, the light emitting element LD may be a rod shape light emitting diode manufactured in a rod shape. The rod shape may include a rod-like shape or a bar-like shape that is longer in a longitudinal direction than a width direction (for example, having aspect ratio greater than 1), such as a cylinder or polygonal column, and a cross-sectional shape thereof is not particularly limited. For example, a length L of the light emitting element LD may be greater than a diameter D (or a width of the cross-section) thereof. Although a rod shape light emitting element LD having a cylindrical shape is shown in FIGS. 7 and 8, a type and/or a shape of the light emitting element LD according to the disclosure are/is not limited thereto.

According to an embodiment, the light emitting element LD may have a size as small as a nano scale to a micro scale (nanometer scale to micrometer scale), for example, the diameter D and/or the length L may be in a range of about 100 nm to about 10 μm. However, the size of the light emitting element LD is not limited thereto. For example, the size of the light emitting element LD may be variously changed according to a design condition of the display device 1 or the like using the light emitting element LD.

The first semiconductor layer 11 may include at least one n-type semiconductor material. For example, the first semiconductor layer 11 may include an n-type semiconductor material including at least one semiconductor material such as InAlGaN, GaN, AlGaN, InGaN, AlN, and InN, and may be doped with a first conductive dopant such as Si, Ge, or Sn. However, the material configuring the first semiconductor layer 11 is not limited thereto, and various materials other than the material described above may configure the first semiconductor layer 11.

The active layer 12 may be disposed on the first semiconductor layer 11 and may be formed with a single or multiple quantum well structure. In an embodiment, a clad layer (not shown) doped with a conductive dopant may be formed on and/or under of the active layer 12. For example, the clad layer may be formed of AlGaN or InAlGaN. According to an embodiment, a material of AlGaN, AlInGaN, or the like may be used to form the active layer 12, and various materials other than the material described above may configure the active layer 12. The active layer 12 may be disposed between the first semiconductor layer 11 and the second semiconductor layer 13 which will be described later.

In case that a voltage greater than or equal to a threshold voltage is applied to both ends of the light emitting element LD, the light emitting element LD may emit light while electron-hole pairs are combined in the active layer 12. By controlling light emission of the light emitting element LD using this principle, the light emitting element LD may be used as a light source of various light emitting elements including a pixel of the display device 1.

The second semiconductor layer 13 may be disposed on the active layer 12 and may include a semiconductor material of a type different from that of the first semiconductor layer 11. For example, the second semiconductor layer 13 may include at least one p-type semiconductor material. For example, the second semiconductor layer 13 may include a p-type semiconductor material including at least one semiconductor material such as InAlGaN, GaN, AlGaN, InGaN, AlN, and InN, and may be doped with a second conductive dopant such as Mg. However, the material configuring the second semiconductor layer 13 is not limited thereto, and various materials other than the material described above may configure the second semiconductor layer 13.

According to an embodiment, a first length L1 of the first semiconductor layer 11 may be longer than a second length L2 of the second semiconductor layer 13 in the longitudinal direction.

According to an embodiment, the light emitting element LD may include an insulating film INF provided on its surface. The insulating film INF may be formed on the surface of the light emitting element LD to surround at least an outer circumferential surface of the active layer 12, and may further surround an area of the first and second semiconductor layers 11 and 13.

However, according to an embodiment, the insulating film INF may expose both ends of the light emitting element LD having different polarities. For example, the insulating film INF may not cover and may expose ends of each of the first and second semiconductor layers 11 and 13 positioned at the both ends of the light emitting element LD on the longitudinal direction, for example, two planes (for example, an upper surface and a lower surface) of a cylinder. In some other embodiments, the insulating film INF may expose the both ends of the light emitting element LD having different polarities and sides of the semiconductor layers 11 and 13 adjacent to the both ends.

According to an embodiment, the insulating film INF may include at least one insulating material such as silicon oxide ($SiO_x$), silicon nitride ($Si_xN_y$), aluminum oxide ($Al_2O_3$), and titanium dioxide ($TiO_2$), but is not limited thereto. For example, a material of the insulating film INF is not particularly limited, and the insulating film INF may include other insulating materials.

In an embodiment, the light emitting element LD may further include an additional component in addition to the first semiconductor layer 11, the active layer 12, the second semiconductor layer 13, and/or the insulating film INF. For example, the light emitting element LD may include one or more phosphor layers, active layers, semiconductor materials and/or electrode layers disposed on an end side of the first semiconductor layer 11, the active layer 12, and/or the second semiconductor layer 13.

In case that a voltage greater than or equal to a threshold voltage is applied to both ends of the light emitting element LD, the light emitting element LD may emit light while electron-hole pairs are combined in the active layer 12. By controlling light emission of the light emitting element LD using this principle, the light emitting element LD may be used as a light source of various display devices 1 including the pixel of the display device 1.

Figure 9:
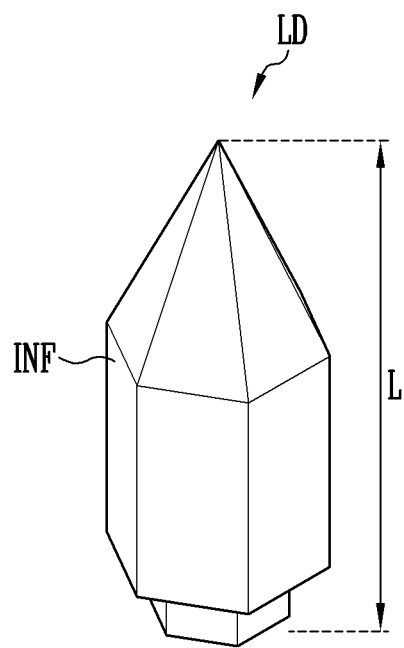
FIGS. 9 and 10 are perspective view and schematic cross-sectional view illustrating a light emitting element according to another embodiment of the disclosure.
Figure 10:
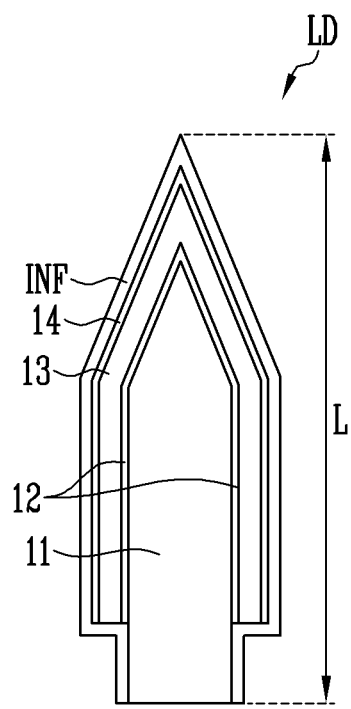

FIGS. 9 and 10 are perspective view and schematic cross-sectional view illustrating a light emitting element according to another embodiment of the disclosure.

Referring to FIGS. 9 and 10, the light emitting element LD according to an embodiment may include a first semiconductor layer 11 and a second semiconductor layer 13, and an active layer 12 disposed between the first and second semiconductor layers 11 and 13. According to an embodiment, the first semiconductor layer 11 may be disposed in a center area of the light emitting element LD, and the active layer 12 may be disposed on a surface of the first semiconductor layer 11 to surround at least an area of the first semiconductor layer 11 The second semiconductor layer 13 may be disposed on a surface of the active layer 12 to surround at least an area of the active layer 12.

The light emitting element LD may further include an electrode layer 14 and/or an insulating film INF surrounding at least an area of the second semiconductor layer 13. For example, the light emitting element LD may include the electrode layer 14 disposed on a surface of the second semiconductor layer 13 to surround an area of the second semiconductor layer 13, and the insulating film INF disposed on a surface of the electrode layer 14 to surround at least one area of the electrode layer 14. For example, the light emitting element LD according to the embodiment may have a core-shell structure including the first semiconductor layer 11, the active layer 12, the second semiconductor layer 13, the electrode layer 14, and the insulating film INF sequentially disposed in an outer direction from a center, but the electrode layer 14 and/or the insulating film INF may be omitted according to an embodiment.

In an embodiment, the light emitting element LD may be provided in a polygonal horn shape extending in a direction. For example, at least an area of the light emitting element LD may have a hexagonal horn shape in a cross-sectional view. However, a shape of the light emitting element LD is not limited thereto, and may be variously changed.

In case that an extension direction of the light emitting element LD is referred to as a length L direction, the light emitting element LD may have a side end (first end) and another side end (second end) in the length L direction. According to an embodiment, one of the first and second semiconductor layers 11 and 13 may be disposed at a side end of the light emitting element LD, and another one of the first and second semiconductor layers 11 and 13 may be disposed at another side end of the light emitting element LD.

In an embodiment of the disclosure, the light emitting element LD may be an ultra-small light emitting diode with a core-shell structure manufactured in a polygonal column shape, for example, a hexagonal horn shape of which both ends are protruded.

In an embodiment, both ends of the first semiconductor layer 11 may have a protruding shape in the length L direction of the light emitting element LD. Shapes of the both ends of the first semiconductor layer 11 may be different from each other. For example, an end disposed on an upper side of the both ends of the first semiconductor layer 11 may have a horn shape tangent to a vertex as a width narrows toward an upper portion. Another end of the first semiconductor layer 11 disposed on a lower side of the both ends of the first semiconductor layer 11 may have a polygonal column shape having a constant width in a cross-sectional view, but is not limited thereto. For example, in another embodiment of the disclosure, the first semiconductor layer 11 may have a polygonal shape, a step shape, or the like in which the width is gradually narrowed toward a lower portion in a cross-sectional view. The shape of the both ends of the first semiconductor layer 11 may be variously changed according to an embodiment, and is not limited to the above-described embodiment.

According to an embodiment, the first semiconductor layer 11 may be positioned at a core, for example, a center (or a center area) of the light emitting element LD. The light emitting element LD may be provided in a shape corresponding to the shape of the first semiconductor layer 11. For example, in case that the first semiconductor layer 11 has a hexagonal horn shape, the light emitting element LD may have a hexagonal horn shape.

Figure 11:
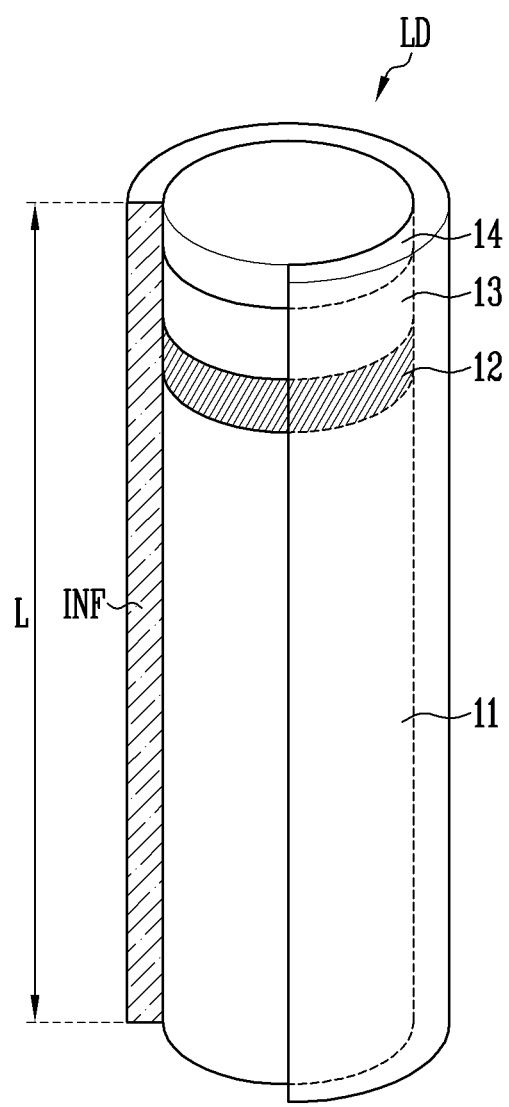
FIG. 11 is a schematic perspective view illustrating a light emitting element according to still another embodiment of the disclosure.

FIG. 11 is a schematic perspective view illustrating a light emitting element according to still another embodiment of the disclosure. In FIG. 11, a portion of the insulating film INF is omitted for convenience of description.

Referring to FIG. 11, the light emitting element LD may further include an electrode layer 14 disposed on the second semiconductor layer 13.

As an embodiment, the electrode layer 14 may be an ohmic contact electrode electrically connected to the second semiconductor layer 13. However, the disclosure is not limited thereto, and in another embodiment, the electrode layer 14 may be a Schottky contact electrode. The electrode layer 14 may include a metal or a metal oxide, and for example, Cr, Ti, Al, Au, Ni, ITO, IZO, ITZO, and an oxide or an alloy thereof may be used alone or in combination. The electrode layer 14 may be substantially transparent or translucent. Therefore, light generated in the active layer 12 of the light emitting element LD may pass through the electrode layer 14 and may be emitted to the outside of the light emitting element LD.

Although not shown separately, in another embodiment, the light emitting element LD may include an electrode layer including the same material as the electrode layer 14 disposed on the first semiconductor layer 11, and the two electrode layers may define each end of the light emitting element LD.

Figure 12:
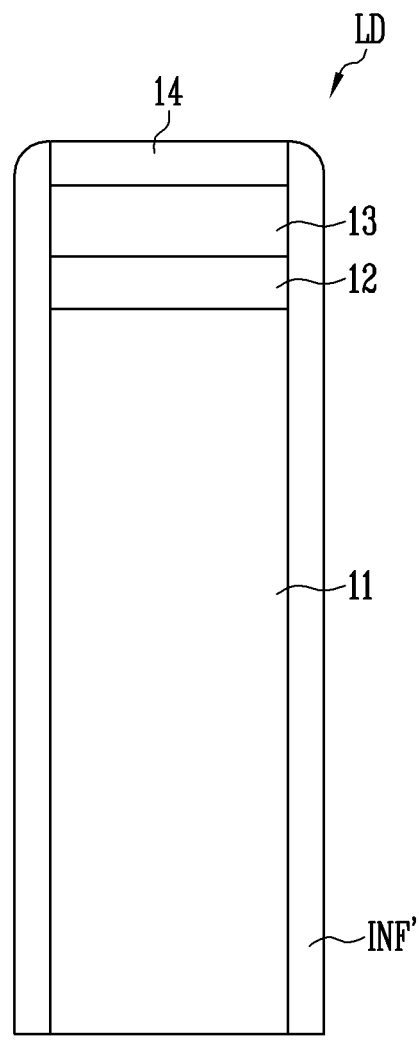
FIG. 12 is a schematic cross-sectional view illustrating a light emitting element according to still another embodiment of the disclosure.

FIG. 12 is a schematic cross-sectional view illustrating a light emitting element according to still another embodiment of the disclosure.

Referring to FIG. 12, an insulating film INF' may have a curved shape in a corner area adjacent to the electrode layer 14. According to an embodiment, the curved surface may be formed by etching when the light emitting element LD is manufactured.

Although not shown separately, in the light emitting element including an additional electrode layer disposed on the first semiconductor layer 11, the insulating film INF' may have a curved shape in an area adjacent to the additional electrode layer.

Figure 13:
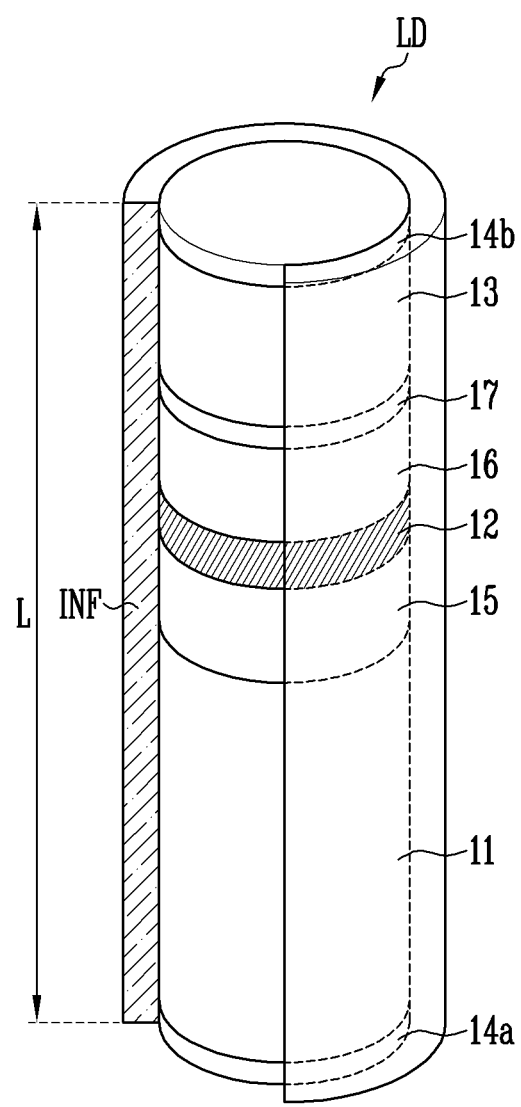
FIG. 13 is a schematic perspective view illustrating a light emitting element according to still another embodiment.

FIG. 13 is a schematic perspective view illustrating a light emitting element according to still another embodiment. In FIG. 13, a portion of the insulating film INF is omitted for convenience of description.

Referring to FIG. 13, the light emitting element LD may further include a third semiconductor layer 15 disposed between the first semiconductor layer 11 and the active layer 12, and a fourth semiconductor layer 16 and a fifth semiconductor layer 17 disposed between the active layer 12 and the second semiconductor layers 13. The light emitting element LD of FIG. 13 is different from the embodiment of FIG. 8, in that the multiple semiconductor layers 15, 16, and 17 and electrode layers 14a and 14b may be further disposed, and the active layer 12 includes another element. A disposition and a structure of the insulating film INF are substantially the same as those of FIG. 8. In FIG. 13, some members are the same as those of FIG. 8, but new reference numerals are given for convenience of description. Hereinafter, an overlapping description is omitted and a different point is described.

As described above, in the light emitting element LD of FIG. 8, the active layer 12 may emit blue or green light by including nitrogen (N). On the other hand, in the light emitting element LD of FIG. 13, each of the active layer 12 and the other semiconductor layers 11, 13, 15, 16 and 17 may be a semiconductor including at least phosphorus (P). For example, the light emitting element LD according to an embodiment may emit red light of which a center wavelength band is in a range of about 620 nm to about 750 nm. However, it should be understood that the center wavelength band of the red light is not limited to the above-described range and includes all wavelength ranges that may be recognized as red in the present technical field.

As an embodiment, the light emitting element LD may include a clad layer disposed adjacent to the active layer 12. As shown in the drawing, the third semiconductor layer 15 and the fourth semiconductor layer 16 disposed between the first semiconductor layer 11 and the second semiconductor layer 13 on and under the active layer 12 may be clad layers.

The third semiconductor layer 15 may be disposed between the first semiconductor layer 11 and the active layer 12. The third semiconductor layer 15 may be an n-type semiconductor identically to the first semiconductor layer 11, and for example, the third semiconductor layer 15 may include a semiconductor material having a chemical formula of $In_xAl_yGa_{1-x-y}P$ ($0 \leq x \leq 1$, $0 \leq y \leq 1$, $0 \leq x \leq y+1$). In an embodiment, the first semiconductor layer 11 may include n-AlGaInP, and the third semiconductor layer 15 may include n-AlInP. However, the disclosure is not limited thereto.

The fourth semiconductor layer 16 may be disposed between the active layer 12 and the second semiconductor layer 13. The fourth semiconductor layer 16 may be an p-type semiconductor identically to the second semiconductor layer 13, and for example, the fourth semiconductor layer 16 may include a semiconductor material having a chemical formula of $In_xAl_yGa_{1-x-y}P$ ($0 \leq x \leq 1$, $0 \leq y \leq 1$, $0 \leq x+y \leq 1$). In an embodiment, the second semiconductor layer 13 may include p-GaP, and the fourth semiconductor layer 16 may include p-AlInP.

The fifth semiconductor layer 17 may be disposed between the fourth semiconductor layer 16 and the second semiconductor layer 13. The fifth semiconductor layer 17 may be a p-doped semiconductor identically to the second semiconductor layer 13 and the fourth semiconductor layer 16. According to an embodiment, the fifth semiconductor layer 17 may reduce a lattice constant difference between the fourth semiconductor layer 16 and the second semiconductor layer 13. For example, the fifth semiconductor layer 17 may be a tensile strain barrier reducing (TSBR) layer. For example, the fifth semiconductor layer 17 may include p-GaInP, p-AlInP, p-AlGaInP, or the like, but is not limited thereto.

The first electrode layer 14a and the second electrode layer 14b may be disposed on the first semiconductor layer 11 and the second semiconductor layer 13, respectively. The first electrode layer 14a may be disposed on a lower surface of the first semiconductor layer 11, and the second electrode layer 14b may be disposed on an upper surface of the second semiconductor layer 13. However, the disclosure is not limited thereto, and according to an embodiment, at least one of the first electrode layer 14a and the second electrode layer 14b may be omitted.

Each of the first electrode layer 14a and the second electrode layer 14b may include at least one of the materials that may be included in the electrode layer 14 of FIG. 7.

A display device according to another embodiment is described. Hereinafter, with respect to the components in the drawings, which are the same as FIGS. 1 to 13, a description is omitted and the same or similar reference numerals are used.

Figure 14:
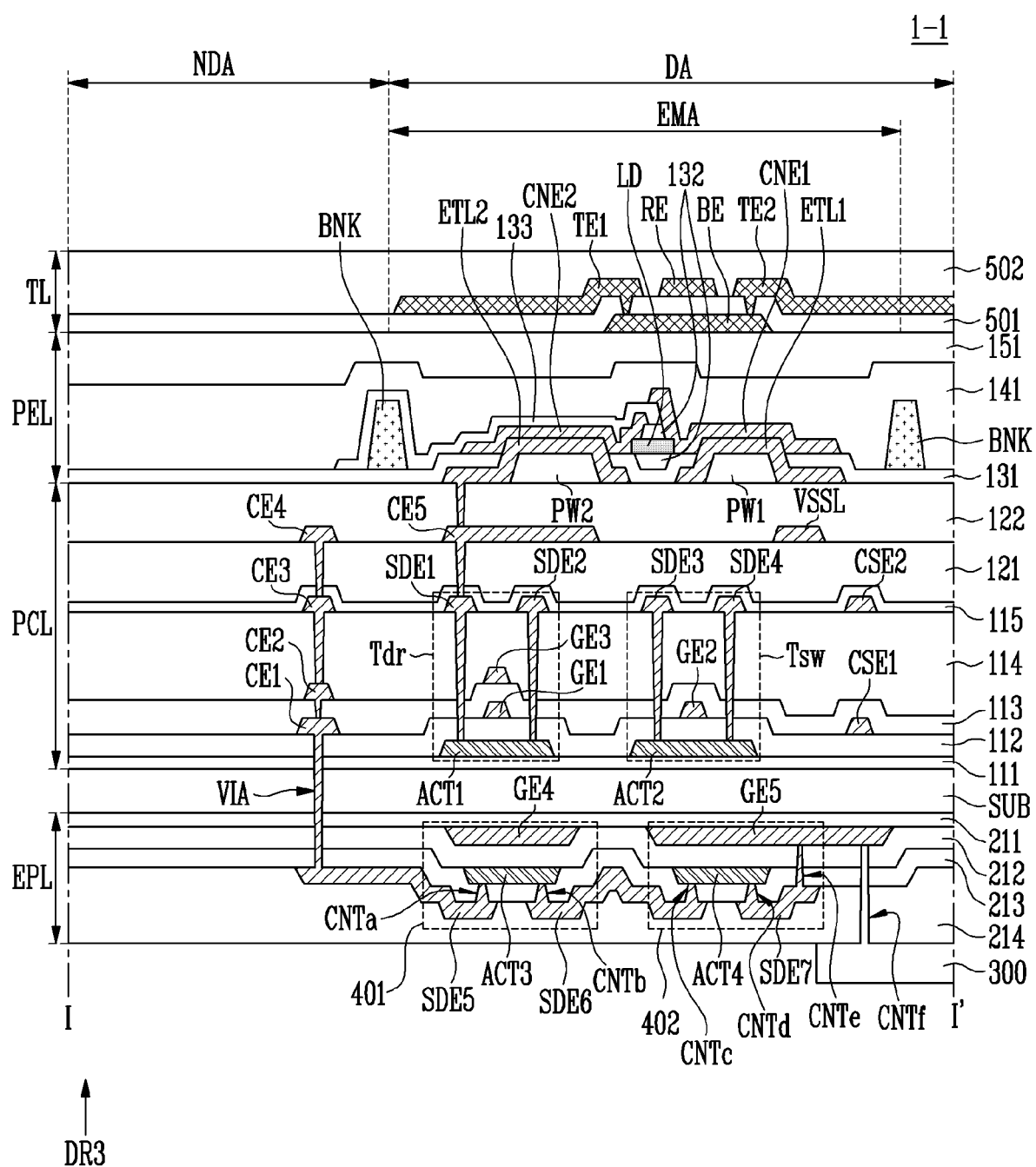
FIG. 14 is a schematic cross-sectional view schematically illustrating a display device according to another embodiment of the disclosure.

FIG. 14 is a schematic cross-sectional view schematically illustrating a display device according to another embodiment of the disclosure.

Referring to FIG. 14, the display device 1-1 according to the present embodiment is different from the display device 1 according to the embodiment of FIG. 3, in that the display device 1-1 further may include a touch sensing layer TL.

As an embodiment, the touch sensing layer TL may be disposed on a front surface of the pixel emission layer PEL. Although not shown, according to an embodiment, a buffer layer may be disposed between the pixel emission layer PEL and the touch sensing layer TL.

The touch sensing layer TL may include multiple sensing electrodes TE1, TE2, RE, and BE. The sensing electrodes TE1, TE2, RE and BE may sense a touch, hovering, gesture, proximity-or-not, or the like by a user's body. The sensing electrodes TE1, TE2, RE, and BE may be configured as different shapes according to various types such as a resistive type, a capacitive type, an electro-magnetic type (EM), and an optical type. For example, in case that the sensing electrodes TE1, TE2, RE, and BE are configured as a capacitive type, the sensing electrodes TE1, TE2, RE, and BE may be configured as a self-capacitive type, a mutual-capacitive type, or the like.

In case that the sensing electrodes TE1, TE2, RE, and BE are configured as a self-capacitive type, each of the sensing electrodes TE1, TE2, RE, and BE may be independently driven, and a sensing signal corresponding to a capacitance formed by each of the sensing electrodes TE1, TE2, RE, and BE and the user's body may be provided to corresponding connecting lines (not shown).

In case that the sensing electrodes TE1, TE2, RE, and BE are configured as a mutual capacitive type, a touch driving signal may be received through a connection line corresponding to first sensing electrodes TE1 and TE2, and a touch sensing signal may be transmitted through a connection line corresponding to the second sensing electrode RE forming a mutual capacitance with the first sensing electrodes TE1 and TE2. In case that the user's body approaches, the mutual capacitance between the first sensing electrodes TE1 and TE2 and the second sensing electrode RE may change, and a touch-or-not of a user may be detected according to a difference of a sensing signal.

Although not shown, according to an embodiment, the sensing electrodes TE1, TE2, RE, and BE may be plate-shaped electrodes of a rhombus shape. The sensing electrodes TE1, TE2, RE, and BE may include a transparent conductive material such as indium tin oxide (ITO), indium zinc oxide (IZO), zinc oxide (ZnO), or indium tin zinc oxide (ITZO).

However, the sensing electrodes TE1, TE2, RE, and BE are not limited to the above-listed shapes, and may have a mesh shape in another embodiment. The sensing electrodes TE1, TE2, RE, and BE may include at least one metal selected from the group consisting of molybdenum (Mo), aluminum (Al), platinum (Pt), palladium (Pd), silver (Ag), magnesium (Mg), gold (Au), nickel (Ni), neodium (Nd), iridium (Ir), chromium (Cr), calcium (Ca), titanium (Ti), tantalum (Ta), tungsten (W), and copper (Cu).

A first touch conductive layer may be disposed on a front surface of the thin film encapsulation layer 151. The first touch conductive layer may include a bridge electrode BE. The bridge electrode BE may perform a function of electrically connecting the adjacent first sensing electrodes TE1 and TE2 or the adjacent second sensing electrodes RE. The bridge electrode BE may include at least one metal selected from the group consisting of molybdenum (Mo), aluminum (Al), platinum (Pt), palladium (Pd), silver (Ag), magnesium (Mg), gold (Au), nickel (Ni), neodium (Nd), iridium (Ir), chromium (Cr), calcium (Ca), titanium (Ti), tantalum (Ta), tungsten (W), and copper (Cu).

A first touch insulating layer 501 may be disposed on a front surface of the first touch conductive layer. The first touch insulating layer 501 may include a contact hole exposing at least a portion of the bridge electrode BE.

A second touch conductive layer may be disposed on a front surface of the first touch insulating layer 501. The second touch conductive layer may include the first sensing electrodes TE1 and TE2 and the second sensing electrode RE. The first sensing electrodes TE1 and TE2 may extend in the first direction DR1 (refer to FIG. 1), and the second sensing electrodes RE may extend in the second direction DR2 (refer to FIG. 1). Since the first sensing electrodes TE1 and TE2 and the second sensing electrodes RE intersect and are disposed on the same layer, one of the two sensing electrodes TE1, TE2, and RE may be electrically connected through the bridge electrode BE to prevent short.

A second touch insulating layer 502 may be disposed on a front surface of the second touch conductive layer. The first touch insulating layer 501 and the second touch insulating layer 502 may include silicon oxide ($SiO_x$), silicon nitride ($SiN_x$), silicon oxynitride, aluminum oxide, tantalum oxide, hafnium oxide, zirconium oxide, titanium oxide, or the like. These may be used alone or in combination with each other.

According to an embodiment, the second touch insulating layer 502 may be a passivation layer or a planarization layer. The passivation layer may include $SiO_x$, $SiN_x$, or the like, and the planarization layer may include a material such as acryl or polyimide. According to an embodiment, the second touch insulating layer 502 may include both of the passivation layer and the planarization layer. A front surface of the second touch insulating layer 502 may be flat.

According to an embodiment, the first touch insulating layer 501 and the second touch insulating layer 502 may be configured as a single layer or multiple layers formed of a stack layer of different materials.

Figure 15:
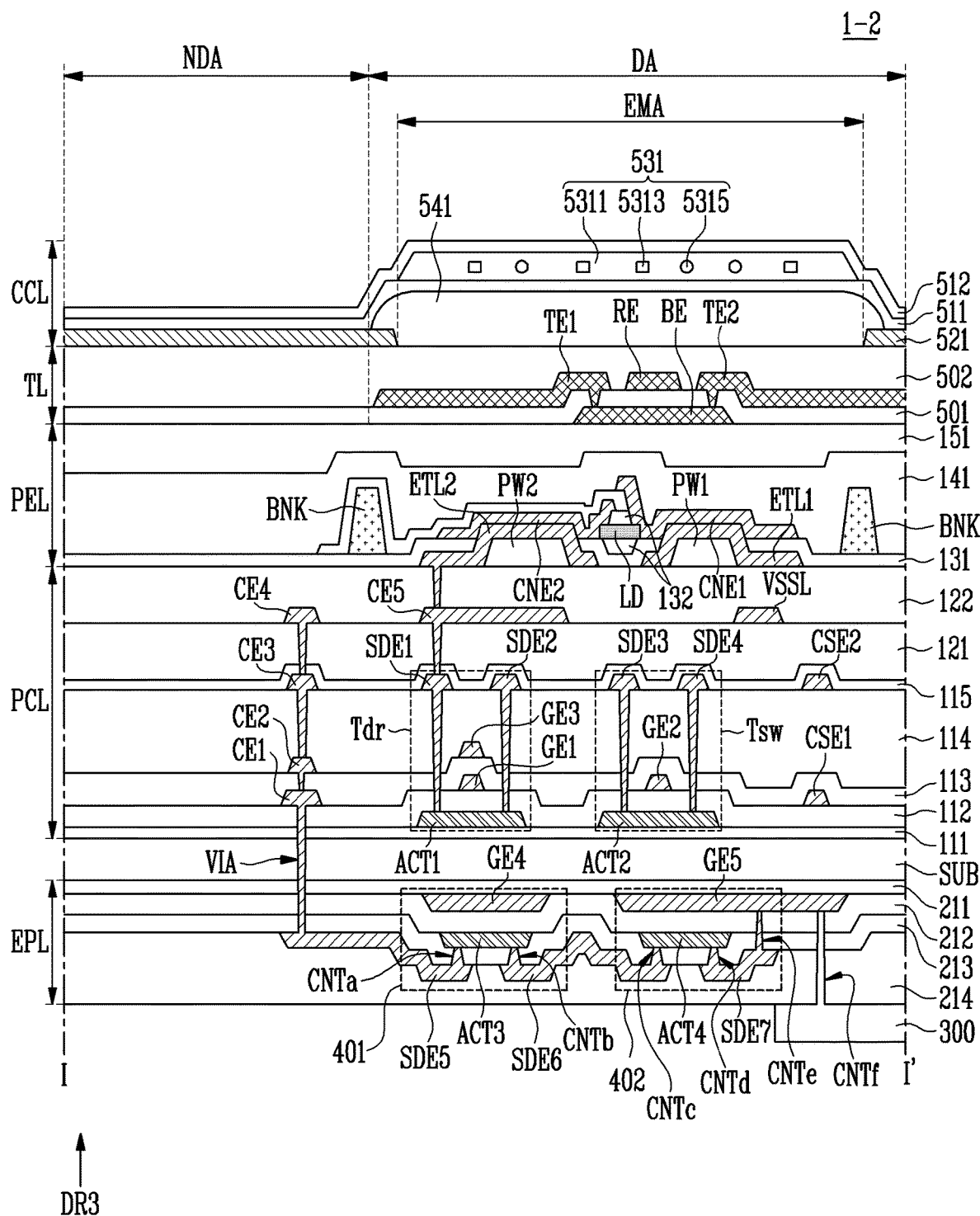
FIG. 15 is a schematic cross-sectional view schematically illustrating a display device according to still another embodiment of the disclosure.

FIG. 15 is a schematic cross-sectional view schematically illustrating a display device according to still another embodiment of the disclosure.

Referring to FIG. 15, the display device 1-2 according to the present embodiment is different from the display device 1-1 according to the embodiment of FIG. 14, in that the display device 1-2 may include a color conversion element layer CCL.

As an embodiment, the color conversion element layer CCL may be disposed on a front surface of the touch sensing layer TL. Although not shown, according to an embodiment, a buffer layer may be disposed between the touch sensing layer TL and the color conversion element layer CCL.

A black matrix 521 may be disposed on a front surface of the second touch insulating layer 502. The black matrix 521 may be disposed along a boundary of each emission area EMA, and may block transmission of light. The black matrix 521 may form an opening by which each of the emission areas EMA are defined.

A material of the black matrix 521 is not particularly limited as long as the material of the black matrix 521 may block light. The black matrix 521 may be formed of, for example, a photosensitive composition, an organic material, a metallic material, or the like. The photosensitive composition may include, for example, a binder resin, a polymerizable monomer, a polymerizable oligomer, a pigment, a dispersant, and the like. The metallic material may include chromium and the like.

A first color conversion filter 541 may be disposed on a front surface of the black matrix 521 and the second touch insulating layer 502. The first color conversion filter 541 may be disposed in the opening of the black matrix 521.

In an embodiment, the first color conversion filter 541 may be a color filter. The color filter may selectively transmit light of a specific color, and absorb light of a different color to block it from travelling. The light passing through the color filter may display one of primary colors such as three primary colors of red, green, and blue. However, a display color of the light passing through the color filter is not limited to the primary colors, and any one of cyan, magenta, yellow, and white-based colors may be displayed.

Since the color filter absorbs external light in a significant level, external light reflection may be reduced without additionally disposing a polarizing plate or the like.

A first capping layer 511 may be disposed on a front surface of the first color conversion filter 541. The first capping layer 511 may prevent the first color conversion filter 541 or the like from being damaged or contaminated by penetration of an impurity such as moisture or air from the outside. The first capping layer 511 may prevent a colorant included in each color filter from diffusing into another element.

As an embodiment, the first capping layer 511 may be formed of an inorganic material. For example, the first capping layer 511 may be include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like.

A second color conversion filter 531 may be disposed on a front surface of the first capping layer 511. A thickness of the second color conversion filter 531 may be in a range of about 2 µm to about 20 µm.

The second color conversion filter 531 may be a wavelength conversion pattern. The wavelength conversion pattern may convert a peak wavelength of incident light into light of another specific peak wavelength and emit the light. The light passing through the wavelength conversion pattern may display one of primary colors such as three primary colors of red, green, and blue. However, a display color of the light passing through the wavelength conversion pattern is not limited to the primary colors, and any one of cyan, magenta, yellow, and white-based colors may be displayed.

The second color conversion filter 531 may include a base resin 5311 and a wavelength conversion material 5313 dispersed in the base resin 5311, and may further include a scatterer 5315 dispersed in the base resin 5311.

A material of the base resin 5311 is not particularly limited as long as the base resin 5311 includes a material having a high light transmittance and an excellent dispersion characteristic for the wavelength conversion material 5313 and the scatterer 5315. For example, the base resin 5311 may include an organic material such as an epoxy-based resin, an acryl-based resin, a cardo-based resin, or an imide-based resin.

The wavelength conversion material 5313 may convert the peak wavelength of the incident light into another specific peak wavelength. An example of the wavelength conversion material 5313 may include a quantum dot (QD), a quantum bar, a phosphor, or the like. The QD may be particulate matter that emits light of a specific wavelength while an electron transits from a conduction band to a valence band.

The QD may include a semiconductor nanocrystalline material. The QD may have a specific band gap according to composition and size thereof, absorb incident light, and emit light having a specific wavelength. An example of a semiconductor nanocrystal of the QD may include group IV nanocrystal, group II-VI compound nanocrystal, group III-V compound nanocrystal, group IV-VI nanocrystal, or a combination thereof.

For example, an example of the group IV nanocrystal may include silicon (Si), germanium (Ge), binary compound such as silicon carbide (SiC) or silicon-germanium (SiGe), or the like, but the disclosure is not limited thereto.

An example of the group II-VI compound nanocrystal may include a binary compound such as CdSe, CdTe, ZnS, ZnSe, ZnTe, ZnO, HgS, HgSe, HgTe, MgSe, MgS, and a mixture thereof, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, or a quaternary compound such as HgZnTeS, CdZnSeS, CdZnSeTe, CdZnSTe, CdHgSeS, CdHgSeTe, CdHgSTe, HgZnSeS, HgZnSeTe and a mixture thereof, but the disclosure is not limited thereto.

An example of the group III-V compound nanocrystal may include a binary compound such as GaN, GaP, GaAs, GaSb, AlN, AlP, AlAs, AlSb, InN, InP, InAs, InSb, and a mixture thereof, a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof, or a quaternary compound such as GaAlNAs, GaAl-NSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but the disclosure is not limited thereto.

An example of the group IV-VI nanocrystal may include a binary compound such as SnS, SnSe, SnTe, PbS, PbSe, PbTe, and a mixture thereof, a ternary compound such as SnSeS, SnSeTe, SnSTe, PbSeS, PbSeTe, PbSTe, SnPbS, SnPbSe, SnPbTe, and a mixture thereof, or a quaternary compound such as SnPbSSe, SnPbSeTe, SnPbSTe, and a mixture thereof, but the disclosure is not limited thereto.

The QD may have a core-shell structure including a core including the nanocrystal described above and a shell surrounding the core. The shell of the QD may serve as a protective layer for maintaining a semiconductor characteristic by preventing chemical modification of the core and/or a charging layer for imparting an electrophoretic characteristic to the QD. The shell may be configured as a single layer or multiple layers. An example of the shell of the QD may include an oxide of metal or nonmetal, a semiconductor compound, a combination thereof, or the like.

For example, an example of the oxide of metal or nonmetal may include a binary compound such as $SiO_x$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, or $CoMn_2O_4$, but the disclosure is not limited thereto.

An example of the semiconductor compound may include CdS, CdSe, CdTe, ZnS, ZnSe, ZnTe, GaAs, GaP, GaSb, HgS, HgSe, HgTe, InAs, InP, InSb, AlAs, AlP, AlSb, and the like, but the present disclosure is not limited thereto.

Light emitted by the wavelength conversion material 5313 may have a light emission wavelength spectrum full width of half maximum (FWHM) of about 45 nm or less, about 40 nm or less, or about 30 nm or less, thereby improving color purity and color reproducibility of a color displayed by the display device 1-2. The light emitted by the wavelength conversion material 5313 may be emitted toward various directions regardless of an incident direction of the incident light. Therefore, side visibility of the display device 1-2 may be improved.

The scatterer 5315 may have a refractive index different from that of the base resin 5311 and form an optical interface with the base resin 5311. For example, the scatterers 5315 may be a light scattering particle. A material of the scatterer 5315 is not particularly limited as long as the scatterer 5315 include a material capable of scattering at least a portion of transmitted light, and may include, for example, a metal oxide particle or an organic particle. An example of the metal oxide may include titanium oxide (TiO2), zirconium oxide (ZrO2), aluminum oxide (Al2O3), indium oxide (In2O3), zinc oxide (ZnO), tin oxide (SnO2), or the like, and an example of an organic particle material may include an acryl-based resin, a urethane-based resin, or the like. The scatterer 5315 may scatter light in a random direction regardless of the incident direction of the incident light without substantially converting a wavelength of the light passing through the second color conversion filter 531. Therefore, a path length of the light passing through the second color conversion filter 531 may be increased, and color conversion efficiency by the wavelength conversion material 5313 may be increased.

A second capping layer 512 may be disposed on a front surface of the second color conversion filter 531. The second capping layer 512 may seal the second color conversion filter 531 together with the first capping layer 511, and thus the second color conversion filter 531 may be prevented from being damaged or contaminated by penetration of impurity such as moisture or air from the outside. The second capping layer 512 may be formed of an inorganic material. The second capping layer 512 may be formed of the same material as the first capping layer 511, or may include at least one of the materials that may be used for the first capping layer 511.

In some other embodiments, the color conversion element layer CCL may be disposed on the front surface of the pixel emission layer PEL in case that the touch sensing layer TL is omitted.

Figure 16:
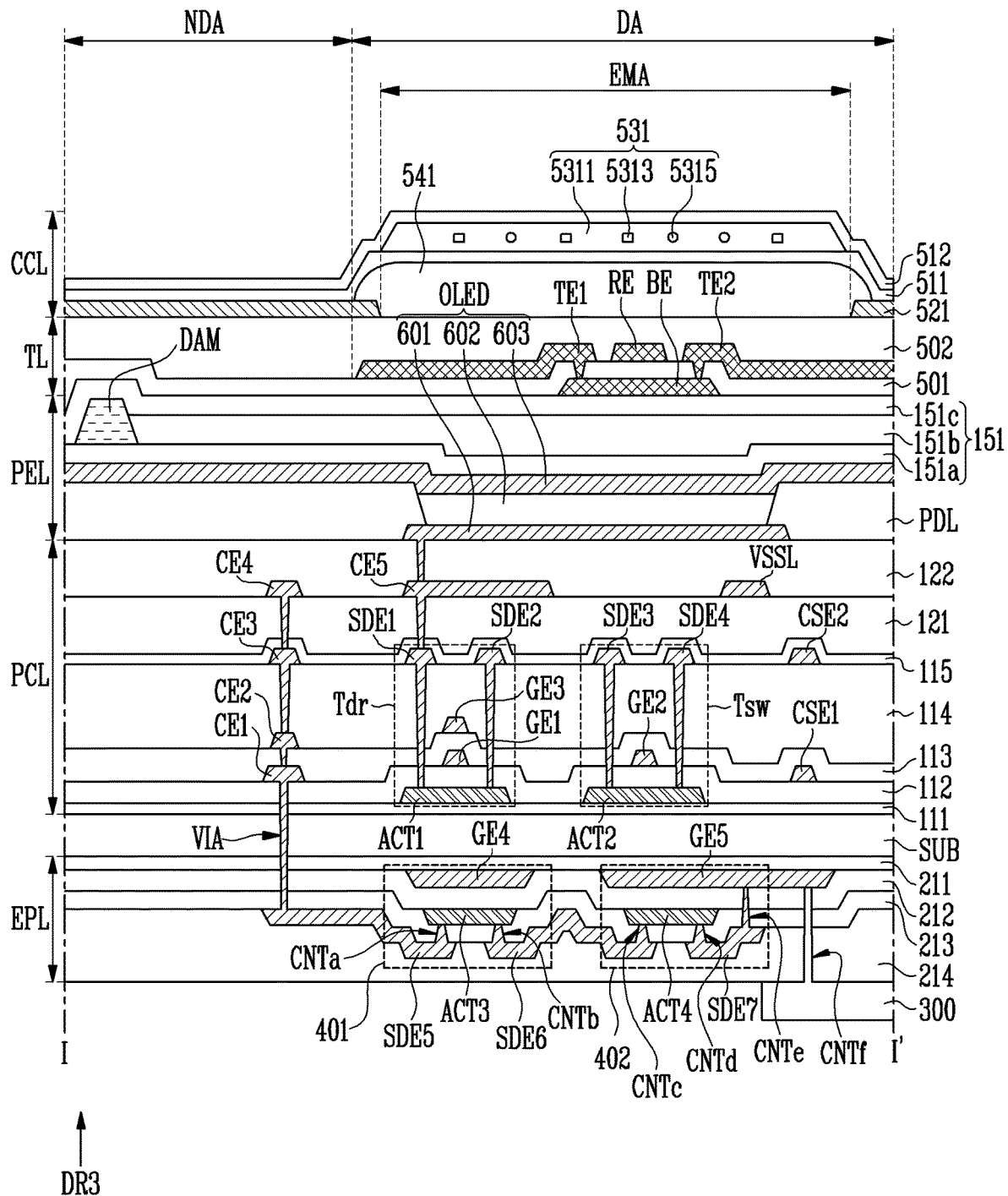
FIG. 16 is a schematic cross-sectional view schematically illustrating a display device according to still another embodiment of the disclosure.

FIG. 16 is a schematic cross-sectional view schematically illustrating a display device according to still another embodiment of the disclosure.

Referring to FIG. 16, the display device 1-3 according to the embodiment is different from the display device 1-2 according to the embodiment of FIG. 15, in that the display device 1-3 may include an organic light emitting diode OLED as a light emitting element.

A first pixel electrode 601 may be disposed on a front surface of the second protective layer 122. The first pixel electrode 601 may be an anode electrode of an organic light emitting diode OLED.

The first pixel electrode 601 may contact the fifth connection electrode CE5 through a contact hole passing through the second protective layer 122. For example, the first pixel electrode 601 may be electrically connected to one of the source electrode SDE2 and the drain electrode SDE1.

The first pixel electrode 601 may include a material having a high work function. The first pixel electrode 601 may include indium-tin-oxide (ITO), indium-zinc-oxide (IZO), zinc oxide (ZnO), indium oxide ($In_2O_3$), or the like.

A pixel defining layer PDL may be disposed on a front surface of the first pixel electrode 601. The pixel defining layer PDL may include an opening exposing at least a portion of the first pixel electrode 601.

The pixel defining layer PDL may include an organic material or an inorganic material. As an embodiment, the pixel defining layer PDL may include a photoresist, a polyimide-based resin, an acryl-based resin, a silicone compound, a polyacrylic-based resin, or the like.

An organic emission layer 602 may be disposed on a front surface of the first pixel electrode 601 exposed by the opening of the pixel defining layer PDL. For example, the organic emission layer 602 may include a hole transport layer, an emission layer, and an electron transport layer, which are sequentially disposed.

A second pixel electrode 603 may be disposed on a front surface of the organic emission layer 602. The second pixel electrode 603 may be a common electrode disposed over the entire display area DA without distinguishing the pixel PX. The second pixel electrode 603 may be a cathode electrode of the organic light emitting diode OLED.

The second pixel electrode 603 may be include a material having a low work function. The second pixel electrode 603 may include Li, Ca, LiF/Ca, LiF/AI, Al, Mg, Ag, Pt, Pd, Ni, Au Nd, Ir, Cr, BaF, Ba, or a compound or a mixture thereof (for example, a mixture of Ag and Mg or the like). The second pixel electrode 603 may include an auxiliary electrode. The auxiliary electrode may include a film formed by depositing the material, and a transparent metal oxide, for example, indium-tin-oxide (ITO), indium-zinc-oxide (IZO), zinc oxide (ZnO), indium-tin-zinc-oxide, and the like.

The first pixel electrode 601, the organic emission layer 602, and the second pixel electrode 603 described above may configure one organic light emitting diode OLED.

A thin film encapsulation layer 151 may be disposed on a front surface of the second pixel electrode 603. The thin film encapsulation layer 151 may include an inorganic layer and/or an organic layer. The thin film encapsulation layer 151 may include multiple layers. The thin film encapsulation layer 151 may be formed of multiple layers including a first inorganic layer 151a, an organic layer 151b, and a second inorganic layer 151c sequentially stacked.

The first inorganic layer 151a and the second inorganic layer 151c may include at least one selected from a group consisting of silicon oxide ($SiO_x$), silicon nitride ($SiN_x$), and silicon oxynitride ($SiO_xN_y$).

The organic layer 151b may include at least one selected from a group consisting of epoxy resin, acrylate, and urethane.

At least one dam DAM may be disposed in the non-display area NDA. For example, the dam may be disposed in the non-display area NDA for preventing the organic layer 151b from overflowing. The dam DAM may be formed to surround at least the display area DA to block an organic material for forming the organic layer 151b from overflowing in an edge direction of the base layer SUB in a formation step of the thin film encapsulation layer 151. In an embodiment, the dam DAM may be disposed on the first inorganic layer 151a, but a position of the dam DAM is not limited thereto. For example, the dam DAM may be disposed at a position sufficient to form a dam structure protruding upward from an outer portion of an area where the organic layer 151b is to be formed to prevent overflow of the organic layer 151b, and a position on a cross-section thereof may be variously changed according to an embodiment. For example, in another embodiment, the dam DAM may be disposed on the same layer as the first inorganic layer 151a or may be disposed on a lower layer of the first inorganic layer 151a.

According to an embodiment, at least one dam surrounding the dam DAM may be additionally disposed outside the dam DAM. For example, the pixel emission layer PEL may further include an additional dam disposed outside the dam DAM to contact an edge of the first inorganic layer 151a and/or the second inorganic layer 151c.

Figure 17:
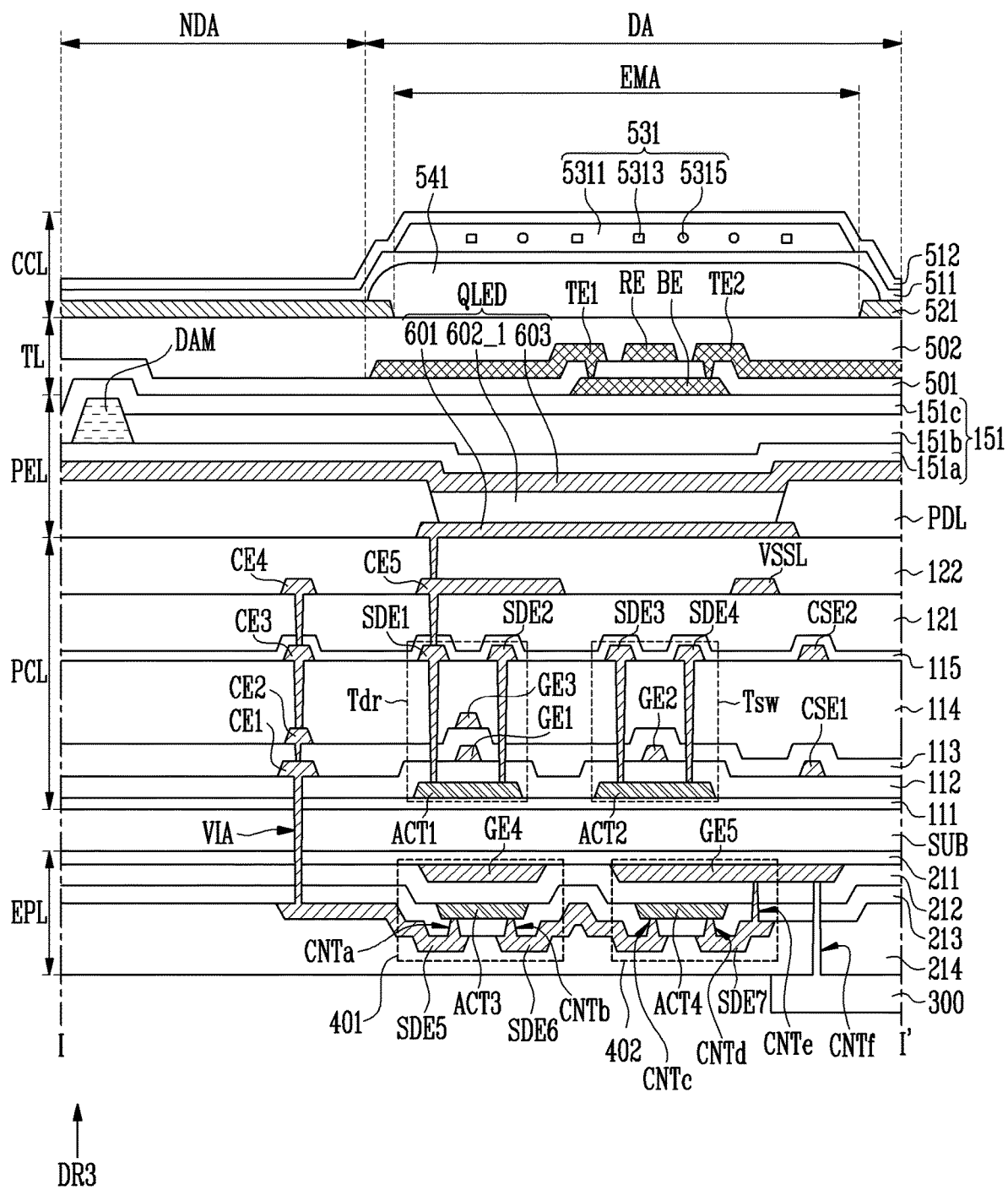
FIG. 17 is a schematic cross-sectional view schematically illustrating a display device according to still another embodiment of the disclosure.

FIG. 17 is a schematic cross-sectional view schematically illustrating a display device according to still another embodiment of the disclosure.

Referring to FIG. 17, the display device 1-4 according to the embodiment is different from the display device 1-3 according to the embodiment of FIG. 16, in that the display device 1-4 may include a quantum dot as a light emitting element.

An inorganic emission layer 602_1 may be disposed between the first pixel electrode 601 and the second pixel electrode 603. The inorganic emission layer 602_1 may include a quantum dot. The quantum dot may include at least one of the materials that may be used for the QD in FIG. 15.

The first pixel electrode 601, the inorganic emission layer 602_1, and the second pixel electrode 603 described above may configure a single quantum dot light emitting diode QLED as a light emitting element.

Figure 18:
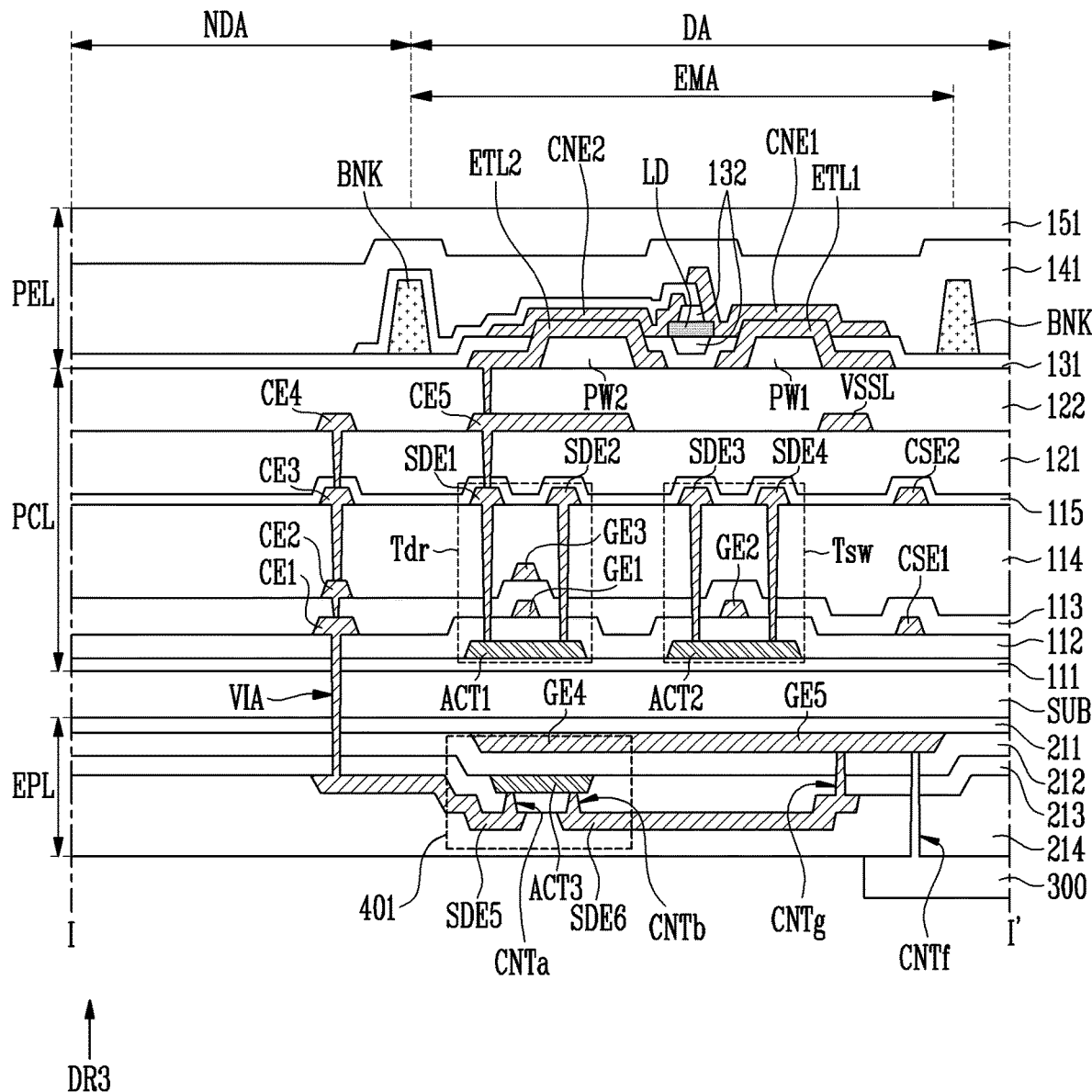
FIG. 18 is a schematic cross-sectional view schematically illustrating a display device according to still another embodiment of the disclosure.

FIG. 18 is a schematic cross-sectional view schematically illustrating a display device according to still another embodiment of the disclosure.

Referring to FIG. 18, the display device 1-5 according to the embodiment is different from the display device 1 according to the embodiment of FIG. 3, in that the second electrostatic diode 402 may be omitted.

As an embodiment, the display device 1-5 may include one electrostatic diode. The driver IC 300 may directly contact the fourth gate electrode GE4 through the contact hole CNTf.

As an embodiment, the second source/drain electrode SDE6 may contact the source area or the drain area of the third semiconductor pattern ACT3 through the contact hole CNTb passing through the second interlayer insulating layer 213, and may contact the fifth gate electrode GE5 through another contact hole CNTg passing through the second interlayer insulating layer 213 and the third gate insulating layer 212.

The first electrostatic diode 401 may be disposed to overlap the display area DA.

Figure 19:
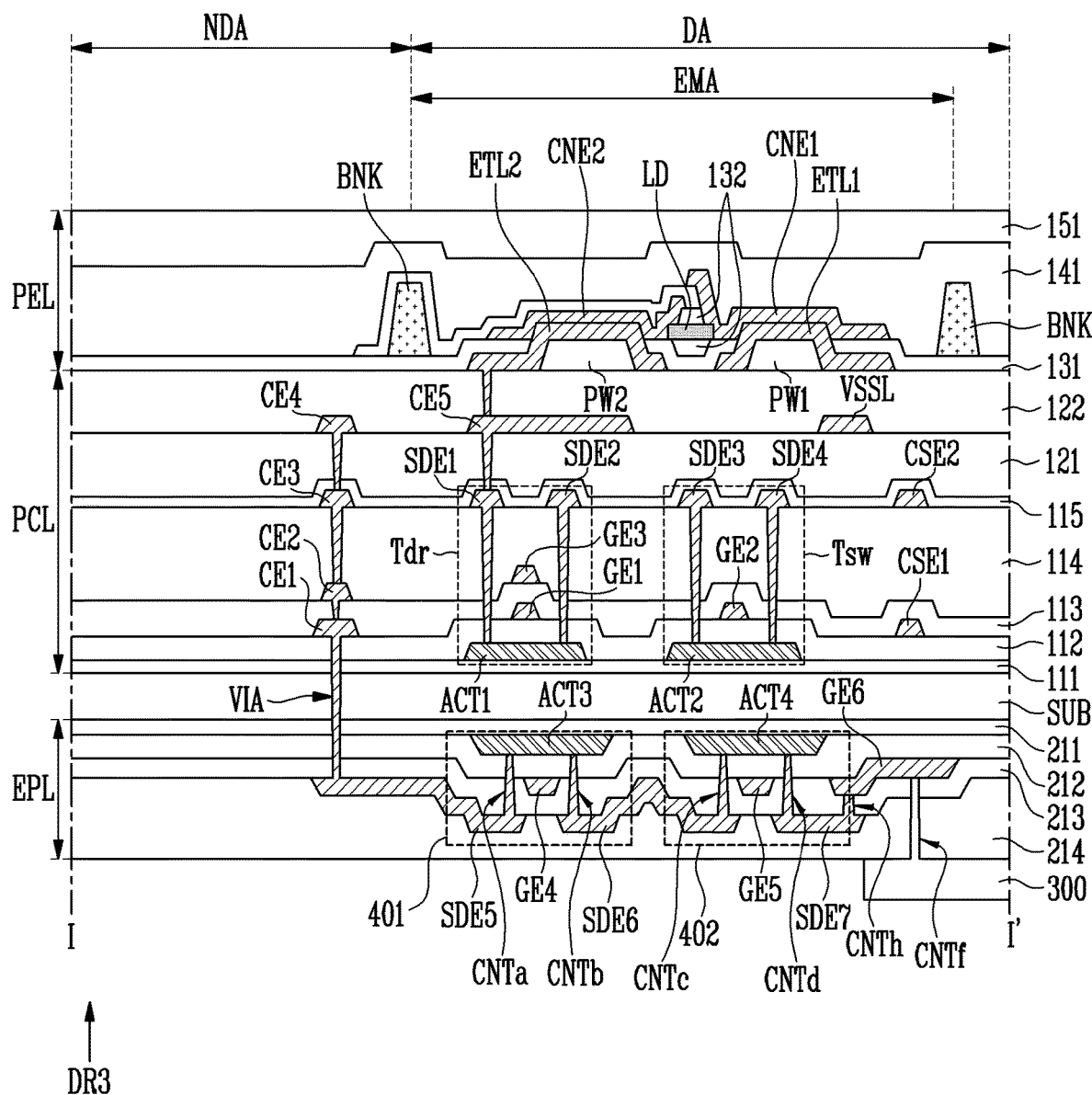
FIG. 19 is a schematic cross-sectional view schematically illustrating a display device according to still another embodiment of the disclosure.

FIG. 19 is a schematic cross-sectional view schematically illustrating a display device according to still another embodiment of the disclosure.

Referring to FIG. 19, the display device 1-6 according to the embodiment is different from the display device 1 according to the embodiment of FIG. 3, in that the electrostatic diodes may be configured as a top gate type.

As an embodiment, the antistatic circuit layer EPL may include the second buffer layer 211, the second panel semiconductor layer AL (refer to FIG. 5), the fifth conductive layer GL (refer to FIG. 4), and the sixth conductive layer SDL (refer to FIG. 6) sequentially stacked on the rear surface of the base layer SUB. The antistatic circuit layer EPL may further includes insulating layers each disposed between the second buffer layer 211, the second panel semiconductor layer AL, the fifth conductive layer GL, and the sixth conductive layer SDL.

The second panel semiconductor layer AL may include the third semiconductor pattern ACT3 and the fourth semiconductor pattern ACT4.

The fifth conductive layer GL may include the fourth gate electrode GE4, the fifth gate electrode GE5, and the sixth gate electrode GE6. According to an embodiment, the sixth gate electrode GE6 may not function as an actual gate electrode of a transistor, and may be an electrode pattern disposed on the fifth conductive layer GL. The sixth gate electrode GE6 may electrically connect the third source/drain electrode SDE7 in the sixth conductive layer SDL and the driver IC 300.

The sixth conductive layer SDL may include the first source/drain electrode SDE5, the second source/drain electrode SDE6, and the third source/drain electrode SDE7. The third source/drain electrode SDE7 may electrically connect the fourth semiconductor pattern ACT4 and the sixth gate electrode GE6.

The third source/drain electrode SDE7 may contact the source area or the drain area of the fourth semiconductor pattern ACT4 through the contact hole CNTd passing through the second interlayer insulating layer 213 and the third gate insulating layer 212, and may contact the sixth gate electrode GE6 through another contact hole CNTh passing through the second interlayer insulating layer 213.

A line (or lines) in the driver IC 300 may be electrically connected to the sixth gate electrode GE6 through the contact hole CNTf passing through the third protective layer 214, the second interlayer insulating layer 213, and the third gate insulating layer 212.

The third semiconductor pattern ACT3, the fourth gate electrode GE4, the first source/drain electrode SDE5, and the second source/drain electrode SDE6 may configure a top gate type of first electrostatic diode 401. The fourth semiconductor pattern ACT4, the fifth gate electrode GE5, the second source/drain electrode SDE6, and the third source/drain electrode SDE7 may also configure a top gate type of second electrostatic diode 402.

Figure 20:
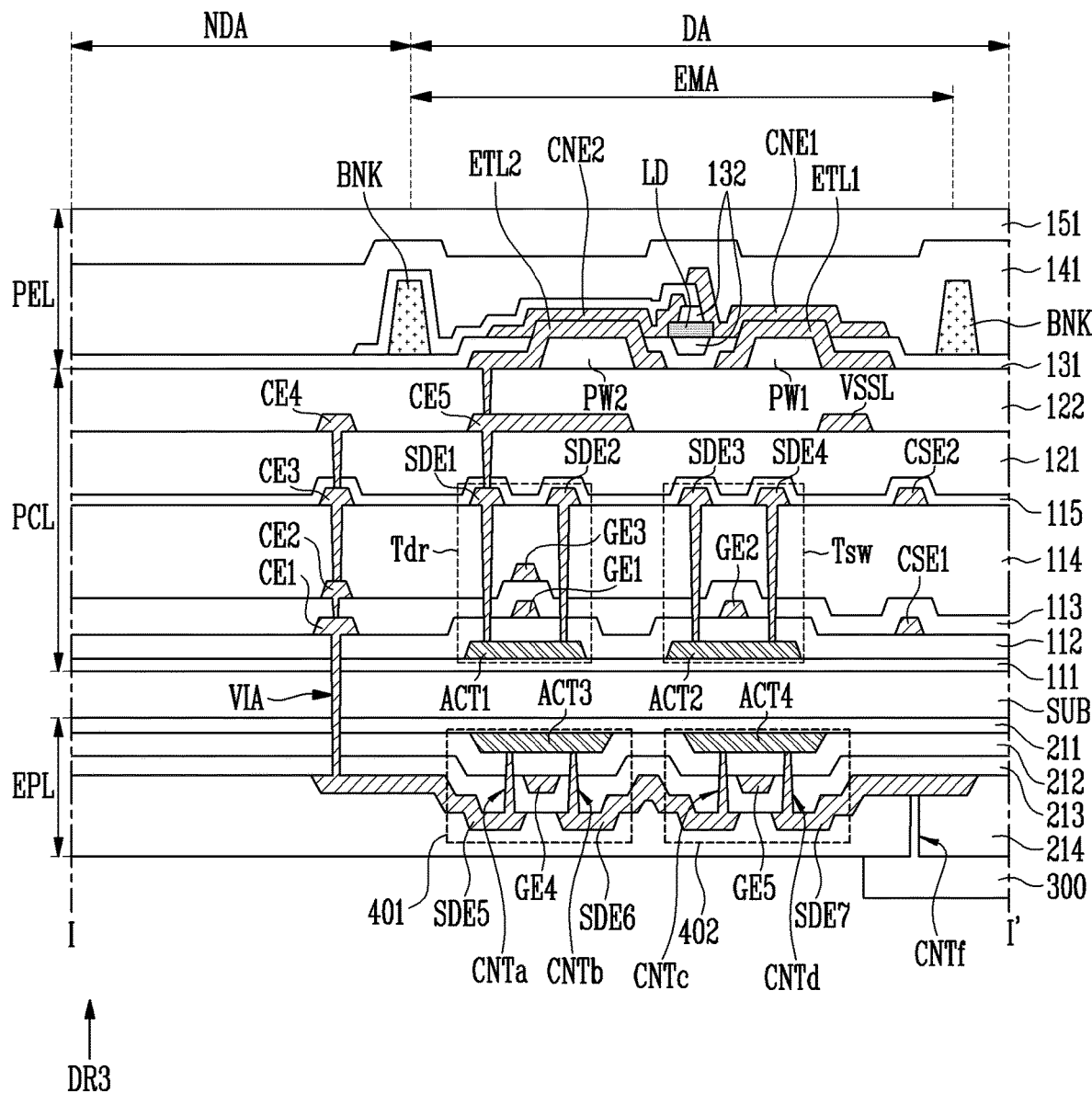
FIG. 20 is a schematic cross-sectional view schematically illustrating a display device according to still another embodiment of the disclosure.

FIG. 20 is a schematic cross-sectional view schematically illustrating a display device according to still another embodiment of the disclosure.

Referring to FIG. 20, the display device 1-7 according to the embodiment is different from the display device 1-6 according to the embodiment of FIG. 19, in that the sixth gate electrode GE6 may be omitted.

According to an embodiment, a line (or lines) of the driver IC 300 may electrically contact the third source/drain electrode SDE7 through the contact hole CNTf.

Figure 21:
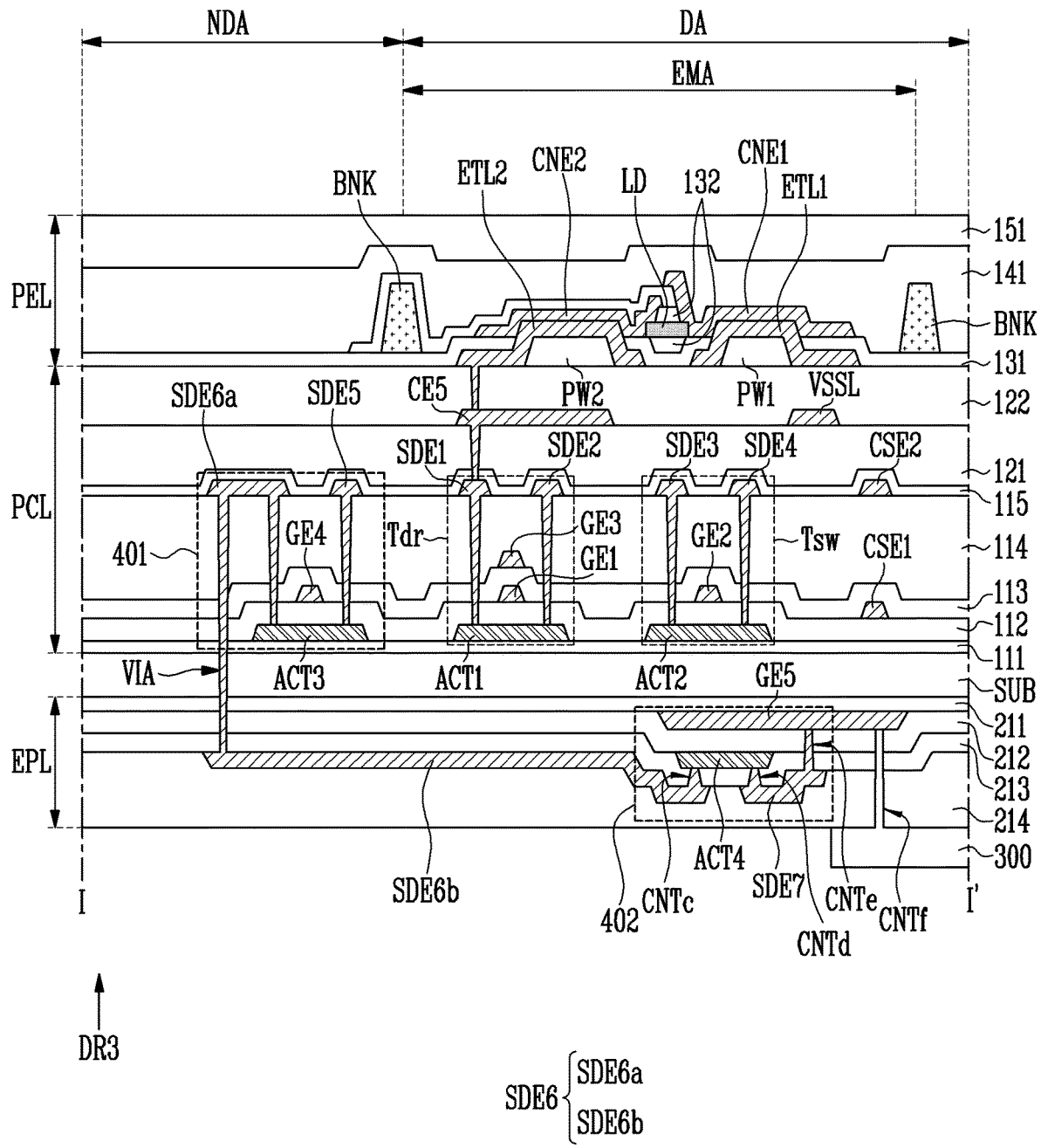
FIG. 21 is a schematic cross-sectional view schematically illustrating a display device according to still another embodiment of the disclosure.

FIG. 21 is a schematic cross-sectional view schematically illustrating a display device according to still another embodiment of the present disclosure.

Referring to FIG. 21, the display device 1-8 according to the embodiment is different from the display device 1 according to the embodiment of FIG. 3, in that the display device 1-8 may include both of a top gate type of electrostatic diode and a bottom gate type of electrostatic diode and at least a portion of the electrostatic diode may be disposed on the front surface of the base layer SUB.

According to an embodiment, the display device 1-8 may include both of the top gate type electrostatic diode and the bottom gate type electrostatic diode. According to an embodiment, both an electrostatic diode disposed on the front surface of the base layer SUB and an electrostatic diode disposed on the rear surface of the base layer SUB may be included. In the embodiment, the first electrostatic diode 401 disposed on the front surface of the base layer SUB may be a top gate type, and the second electrostatic diode 402 disposed on the rear surface of the base layer SUB may be the bottom gate type, but an embodiment is not limited thereto. Those skilled in the art may configure an electrostatic diode disposed on the rear surface of the base layer SUB as a top gate type and may configure the rest as a bottom gate type, or may configure the first electrostatic diode 401 disposed on the front surface of the base layer SUB as a top gate type.

As an embodiment, the first electrostatic diode 401 may be disposed to overlap the non-display area NDA, and the second electrostatic diode 402 may be disposed to overlap the display area DA.

The first panel semiconductor layer may include the third semiconductor pattern ACT3. The first conductive layer may include the fourth gate electrode GE4. The third conductive layer may include the first source/drain electrode SDE5 and a first sub source/drain electrode SDE6a.

As an embodiment, the third semiconductor pattern ACT3, the fourth gate electrode GE4, the first source/drain electrode SDE5, and the first sub source/drain electrode SDE6a may configure the top gate type first electrostatic diode 401.

The second electrostatic diode 402 may include a second sub source/drain electrode SDE6b disposed on the sixth conductive layer SDL. The second sub source/drain electrode SDE6b may contact the source area or the drain area of the fourth semiconductor pattern ACT4 through a contact hole.

As an embodiment, the second sub source/drain electrode SDE6b may contact the first sub source/drain electrode SDE6a through the via hole VIA passing through the second interlayer insulating layer 213, the third gate insulating layer 212, the second buffer layer 211, the base layer SUB, the first buffer layer 111, the first gate insulating layer 112, the second gate insulating layer 113, and the first interlayer insulating layer 114. The first sub source/drain electrode SDE6a and the second sub source/drain electrode SDE6b may be electrically connected to each other to have the function of the second source/drain electrode SDE6 described above in FIG. 3.

Figure 22:
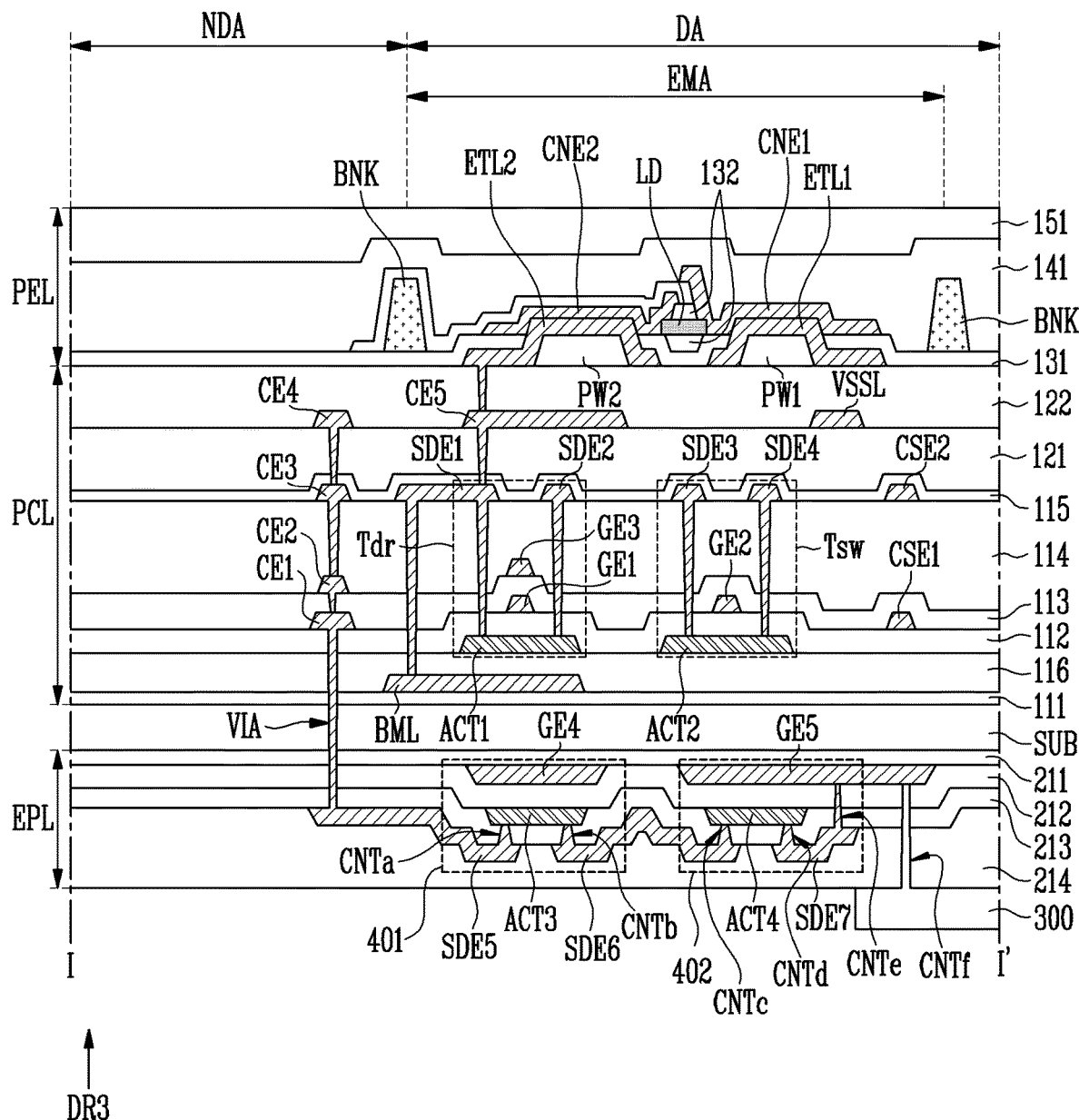
FIG. 22 is a schematic cross-sectional view schematically illustrating a display device according to still another embodiment of the disclosure.

FIG. 22 is a schematic cross-sectional view schematically illustrating a display device according to still another embodiment of the disclosure.

Referring to FIG. 22, the display device 1-9 according to the embodiment is different from the display device 1 according to the embodiment of FIG. 3, in that the first transistor may be a double gate type.

A seventh conductive layer may be disposed on a front surface of the first buffer layer 111. The seventh conductive layer may be patterned to form a bottom gate electrode BML of the first transistor Tdr. As an embodiment, the seventh conductive layer may include at least one of molybdenum (Mo), aluminum (Al), copper (Cu), and titanium (Ti). The seventh conductive layer may be configured as a single layer or multiple layers. As an embodiment, the bottom gate electrode BML may have a size (or an area) greater than that of the first semiconductor pattern ACT1.

In some other embodiments, the bottom gate electrode BML may include a light blocking/shielding function. For example, by blocking light or an electromagnetic wave incident from a lower portion of the first transistor Tdr toward the first semiconductor pattern ACT1, a leakage current and deterioration of the first transistor Tdr due to the light or the electromagnetic wave may be prevented, and thus output stability of the first transistor Tdr may be improved. In order to perform such a function, the bottom gate electrode BML may be formed of an opaque metal material, a semiconductor material, or a light absorption material. The bottom gate electrode BML may include at least one semiconductor material among silicon (Si), germanium (Ge), and silicon-germanium (SiGe), which is a dielectric material having an electrical conductivity and a light absorption coefficient.

The first panel semiconductor layer may be disposed on a front surface of the seventh conductive layer, and an insulating layer 116 may be disposed between the seventh conductive layer and the first panel semiconductor layer.

One of the source electrode SDE2 and the drain electrode SDE1 of the first transistor Tdr may contact the first semiconductor pattern ACT1 and the bottom gate electrode BML through a contact hole.

Although the embodiments of the disclosure have been described with reference to the accompanying drawings, those skilled in the art will understand that the embodiments may be implemented in other specific forms without departing from the technical spirit and essential features of the disclosure. Therefore, it should be understood that the embodiments described above are illustrative and are not restrictive in all aspects.

The invention claimed is:

1. A display device comprising:
   a base layer including a display area and a non-display area;
   a pixel circuit layer disposed on a front surface of the base layer and including a driving transistor and a switch transistor; and
   an antistatic circuit layer disposed on a rear surface of the base layer and including an electrostatic diode.

2. The display device according to claim 1, wherein the electrostatic diode is disposed to overlap the display area in a thickness direction of the base layer.

3. The display device according to claim 2, further comprising:
   a driver IC disposed on a rear surface of the antistatic circuit layer,
   wherein a line of the driver IC is electrically connected to the electrostatic diode.

4. The display device according to claim 1, wherein the electrostatic diode is in a transistor form.

5. The display device according to claim 4, wherein the electrostatic diode is a bottom gate type.

6. The display device according to claim 1, further comprising: a via hole passing through the front surface and the rear surface of the base layer.

7. The display device according to claim 6, wherein
   the pixel circuit layer further includes a connection electrode, and
   the connection electrode is electrically connected to the electrostatic diode of the antistatic circuit layer through the via hole.

8. The display device according to claim 1, wherein a width of the non-display area is less than or equal to about 1 mm in a plan view.

9. The display device according to claim 1, further comprising:
   a pixel emission layer disposed on a front surface of the pixel circuit layer and including a light emitting element.

10. The display device according to claim 9, wherein
    the pixel emission layer further comprises:
    a first electrode electrically connected to the driving transistor; and
    a second electrode disposed to be spaced apart from the first electrode, and
    the light emitting element is electrically connected to the first electrode and the second electrode.

11. The display device according to claim 10, wherein a length of the light emitting element is in a range of about 100 nm to about 10 μm.

12. The display device according to claim 9, further comprising:
    a color conversion element layer disposed on the front surface of the pixel emission layer and including a quantum dot.

13. The display device according to claim 1, wherein the electrostatic diode includes an oxide semiconductor.

14. The display device according to claim 3, wherein the antistatic circuit layer includes a first electrostatic diode and a second electrostatic diode electrically connected in series with each other.

15. The display device according to claim 14, wherein the first electrostatic diode includes:
   a first gate electrode;
   a first semiconductor pattern overlapping the first gate electrode in the thickness direction of the base layer; and
   a first source/drain electrode and a second source/drain electrode, each electrically contacting the first semiconductor pattern, and
   the second electrostatic diode includes:
   a second gate electrode;
   a second semiconductor pattern overlapping the second gate electrode in the thickness direction; and
   the second source/drain electrodes and a third source/drain electrode, each electrically contacting the second semiconductor pattern.

16. The display device according to claim 15, wherein the first source/drain electrode and the third source/drain electrode are different portions of an electrode pattern.

17. The display device according to claim 15, wherein the first gate electrode and the second gate electrode are separated from each other.

18. The display device according to claim 15, wherein
   the first source/drain electrode is electrically connected to a connection electrode disposed in the pixel circuit layer, and
   the third source/drain electrode is electrically connected to the line of the driver IC.

19. The display device according to claim 14, wherein the first electrostatic diode and the second electrostatic diode are diode-connected transistors electrically connected in opposite directions.

20. A display device comprising:
   a base layer;
   a pixel circuit layer disposed on the base layer and including a driving transistor and a switch transistor; and
   an antistatic circuit layer including at least one an electrostatic diode and disposed in a direction different from a direction the pixel circuit layer is disposed.

21. The display device according to claim 20, further comprising:
   a pixel emission layer including a light emitting element, and disposed in a direction different from of the direction the antistatic circuit layer is disposed.

22. The display device according to claim 21, wherein the electrostatic diode is disposed to overlap an emission area defined by the light emitting element in a thickness direction of the base layer.

23. The display device according to claim 20, wherein
   the pixel circuit layer is disposed on a front surface of the base layer, and
   the antistatic circuit layer is disposed on a rear surface of the base layer.

24. The display device according to claim 23, wherein the antistatic circuit layer is formed after the pixel circuit layer is formed.

25. The display device according to claim 20, further comprising:
   a via hole passing through between a front surface and a rear surface of the base layer,
   wherein the via hole is formed after the pixel circuit layer is formed and before the antistatic circuit layer is formed.

* * * * *